(12) United States Patent
Mawatari et al.

(10) Patent No.: US 8,093,623 B2
(45) Date of Patent: Jan. 10, 2012

(54) SEMICONDUCTOR INTEGRATED CIRCUIT

(75) Inventors: Kouzou Mawatari, Kanagawa (JP); Motoyasu Yano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/588,891

(22) Filed: Nov. 2, 2009

(65) Prior Publication Data
US 2010/0133583 A1  Jun. 3, 2010

(30) Foreign Application Priority Data

Nov. 28, 2008 (JP) ................................. 2008-305039

(51) Int. Cl.
H01L 29/66 (2006.01)

(52) U.S. Cl. . 257/173; 257/491; 257/495; 257/E29.211; 257/E29.219

(58) Field of Classification Search .................. 257/173, 257/491, 495, E29.211, E29.219
See application file for complete search history.

(56) References Cited

U.S. PATENT DOCUMENTS

| | | | | |
|---|---|---|---|---|
| 5,631,793 A * | 5/1997 | Ker et al. | ............ | 361/56 |
| 6,940,104 B2 * | 9/2005 | Yeh et al. | ............ | 257/104 |
| 7,348,657 B2 * | 3/2008 | Pequignot et al. | ............ | 257/546 |
| 2004/0100314 A1 * | 5/2004 | Kim et al. | ............ | 327/176 |
| 2004/0164354 A1 * | 8/2004 | Mergens et al. | ............ | 257/355 |

FOREIGN PATENT DOCUMENTS

| | | | |
|---|---|---|---|
| JP | 63-228667 A | 9/1988 | |
| JP | 02-087674 A | 3/1990 | |
| JP | 02-268460 A | 11/1990 | |
| JP | 05-055839 A | 3/1993 | |
| JP | 3327060 | 2/1997 | |
| JP | 11-041084 A | 2/1999 | |
| JP | 2000-353782 A | 12/2000 | |
| JP | 2000-357775 A | 12/2000 | |
| JP | 2001-298157 A | 10/2001 | |
| JP | 2003-023101 A | 1/2003 | |
| JP | 2004-221569 A | 8/2004 | |
| JP | 2005-064374 A | 3/2005 | |
| JP | 2006-100532 A | 4/2006 | |
| JP | 2006-518941 T | 8/2006 | |
| WO | WO-2004/075370 A2 | 9/2004 | |

OTHER PUBLICATIONS

Japanese Office Action issued Nov. 30, 2010 for corresponding Japanese Application No. 2008-305039.
Japanese Office Action issued Mar. 8, 2011 for corresponding Japanese Application No. 2008-305039.

* cited by examiner

*Primary Examiner* — Tu-Tu V Ho
(74) *Attorney, Agent, or Firm* — Rader, Fishman & Grauer, PLLC

(57) ABSTRACT

Disclosed herein is a semiconductor integrated circuit including a protected circuit; and a protection element formed on the same semiconductor substrate as the protected circuit and adapted to protect the protected circuit, wherein the protection element includes two diodes having their anodes connected together to form a floating node and two cathodes connected to the protected circuit, the two diodes are formed in a well-in-well structure on the semiconductor substrate, and the well-in-well structure includes a P-type well forming the floating gate, an N-type well which surrounds the surfaces of the P-type well other than that on the front side of the substrate with the deep portion side of the substrate so as to form the cathode of one of the diodes, and a first N-type region formed in the P-type well so as to form the cathode of the other diode.

6 Claims, 20 Drawing Sheets

F I G . 2
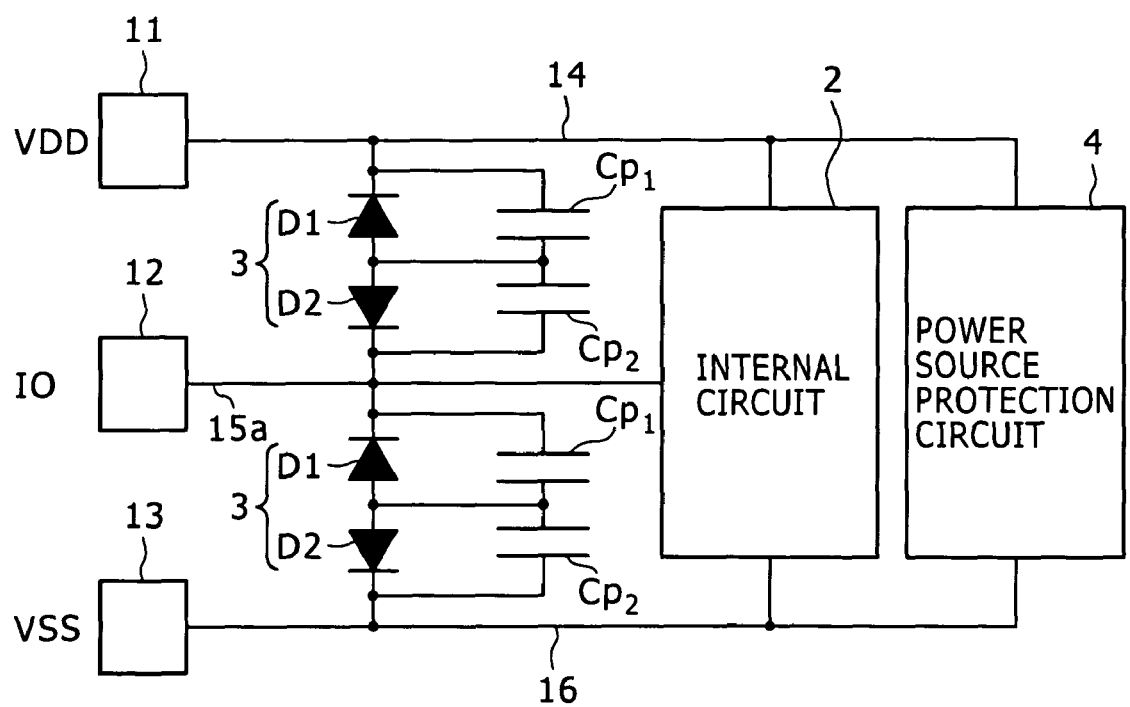

FIG. 7A  <u>1E</u>
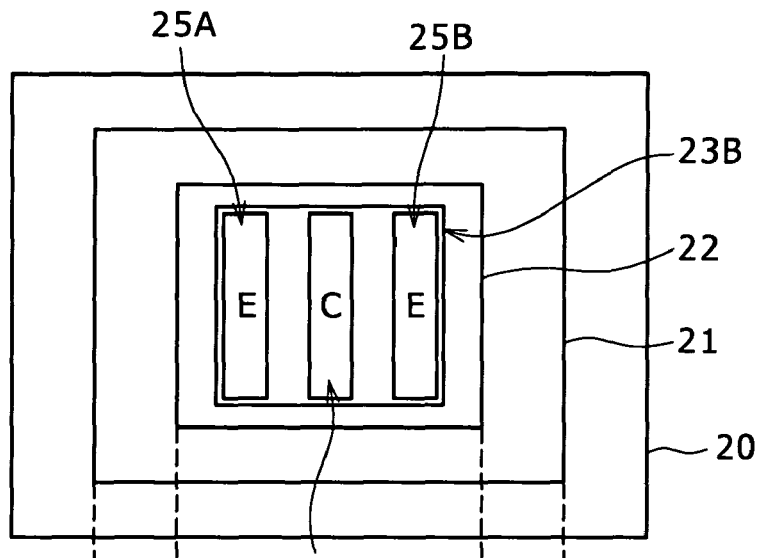
FIG. 7B
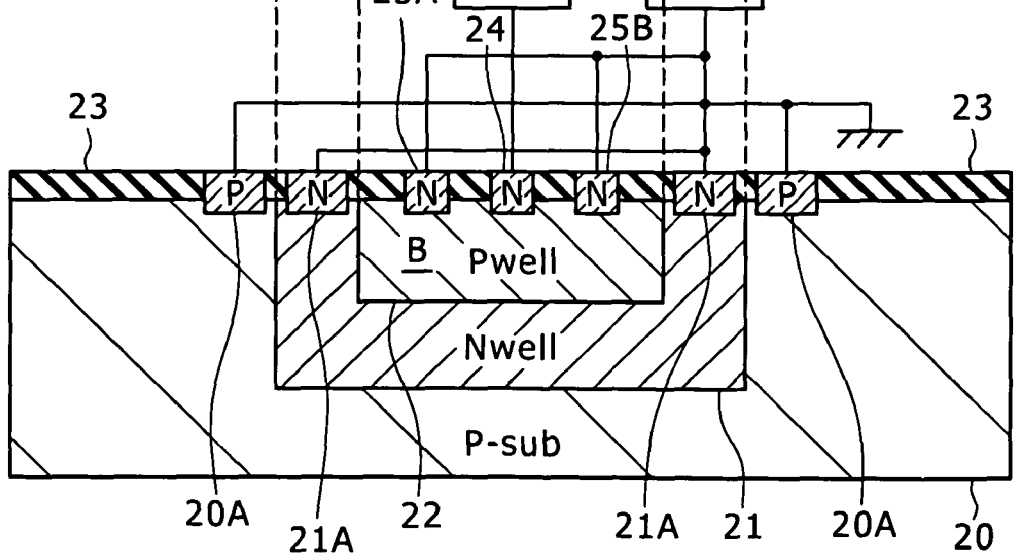

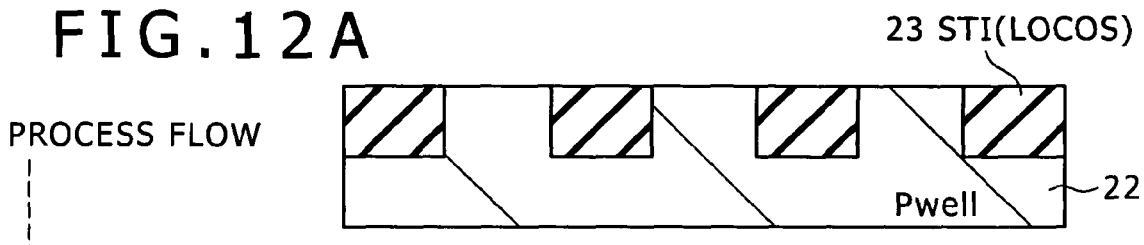
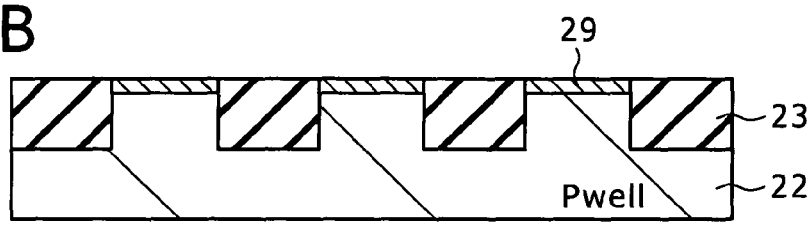
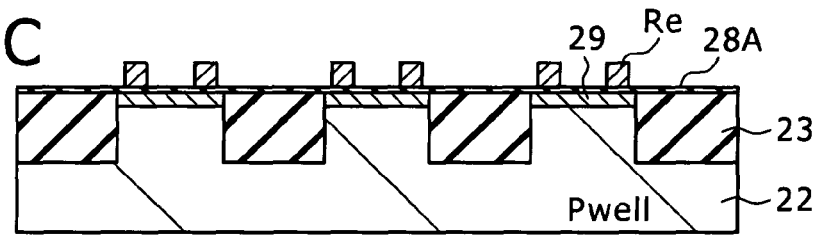
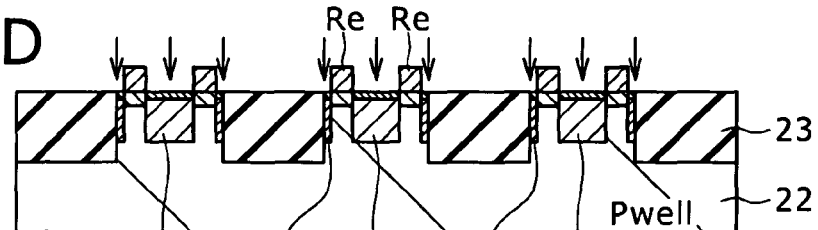
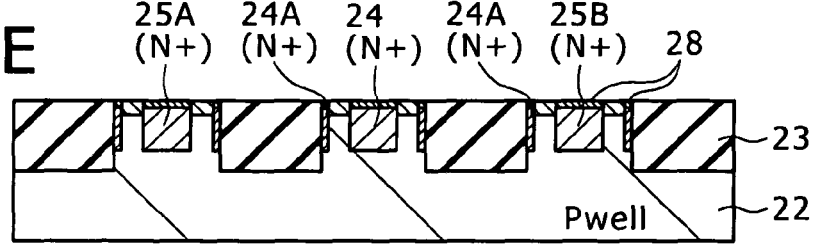
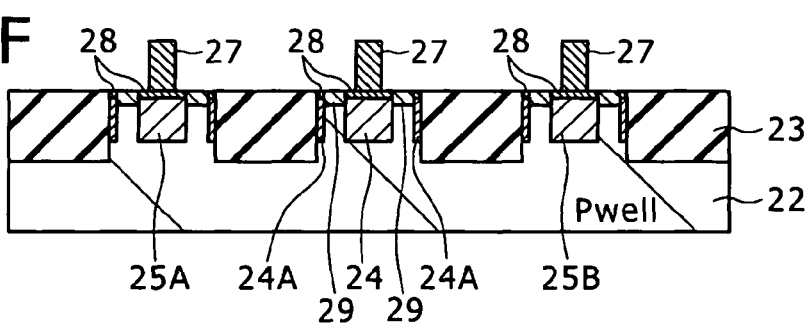

FIG.14A  1Ea
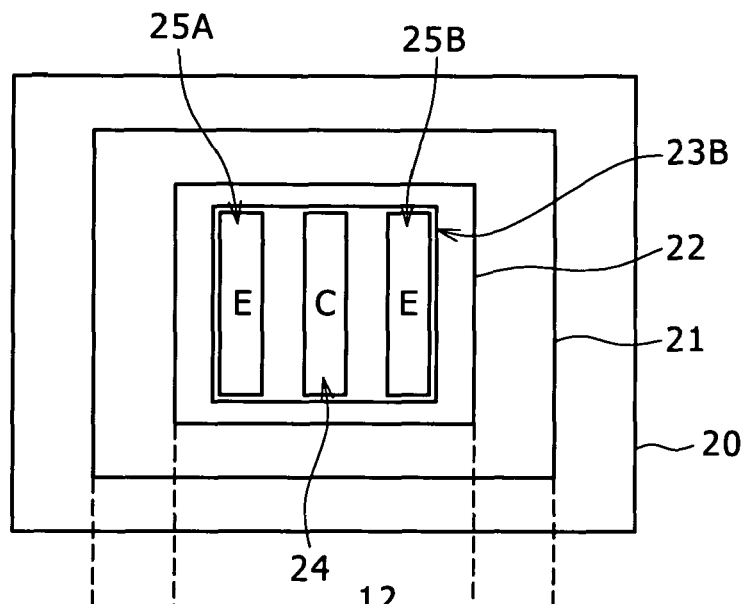
FIG.14B
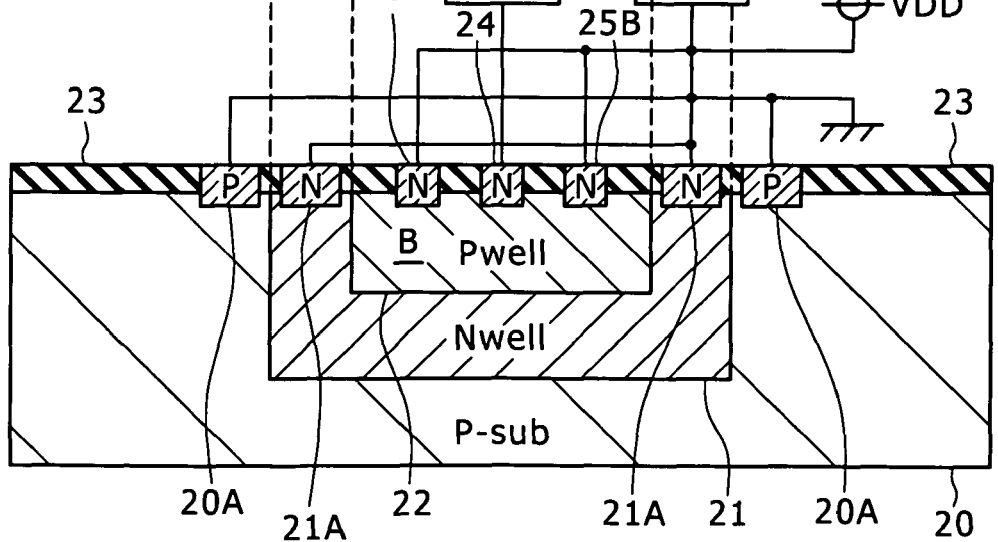

SEMICONDUCTOR INTEGRATED CIRCUIT

BACKGROUND OF THE INVENTION

1. Field of the Invention

The present invention relates to a semiconductor integrated circuit having a protection element which is connected to an element or circuit to be protected (protected circuit) so as to remove input noise.

2. Description of the Related Art

Some semiconductor integrated circuits have a protection element adapted to perform electrostatic discharge (ESD) so as to protect the internal circuit from static electricity which finds its way into the circuit from an external terminal.

An ESD protection element is connected between two wirings connected to the internal circuit. One of such wirings is, for example, a supply line (hereinafter VDD line) of a source voltage VDD or a supply line (hereinafter VSS line) of a reference voltage VSS (e.g., GND voltage). The other of such wirings is, for example, a signal line. On the other hand, a power line discharge element (a type of ESD protection element) may be connected between the VDD and VSS lines to ensure positive ESD protection by discharging the charge of the VDD line to the VSS line.

A thyristor may be used as an ESD protection element (refer, for example, to Chih-Yao Huang etc., "Design Optimization of ESD protection and latchup prevention for a serial I/O IC," Microelectronics Reliability 44 (2004) 213-221).

Some ESD protection elements have a single or a plurality of diodes connected between two wirings so as to face the same direction. This type of protection element will be hereinafter referred to as a "unidirectional diode protection element."

If connected, for example, between the VDD and signal lines, a unidirectional diode protection element is connected in such an orientation as to turn ON when a voltage higher than the VDD line voltage is supplied to the signal line. On the other hand, if connected between the VSS and signal lines, a unidirectional diode protection element is connected in such an orientation as to turn ON when a voltage lower than the VSS line voltage is supplied to the signal line.

Some ESD protection elements use a GGMOS (Gate-Grounded MOSFET) provided between two wirings (refer, for example, to Japanese Patent No. 3327060). This GGMOS is formed simultaneously with the MOSFET making up the internal circuit.

A GGMOS protection element is a so-called diode-connected transistor having its gate and source shorted together. Therefore, this type of protection element has to be connected in proper orientation as with a diode. A GGMOS protection element is connected between two wirings in the same orientation as with the above unidirectional diode protection element.

SUMMARY OF THE INVENTION

A thyristor has a low ON resistance, making it suitable for passing a large current. However, it has a high trigger voltage, making it difficult to adjust the trigger voltage. As a result, using a thyristor in an internal circuit with a low withstand voltage may damage the internal circuit before the thyristor turns ON.

GGMOS and unidirectional diode protection elements are not applicable, for example, to a signal line or the like whose signal potential could conceivably exceed the VDD potential or fall below the VSS potential due to a significant fluctuation of the signal DC level. The reason for this is that these protection elements clip the input potential at the VDD or VSS level when a potential beyond the VDD potential or below the VSS potential is supplied. This results in distortion of the signal having such a waveform.

Further, a GGMOS protection element may not track a high-frequency signal input because of its large parasitic capacitance, resulting in attenuation of the signal.

It is an aim of the embodiments of the present invention to provide a semiconductor integrated circuit having a protection element with a small parasitic capacitance for preventing or suppressing signal wave distortion.

A semiconductor integrated circuit according to a first mode of the present invention includes a protected circuit and a protection element. The protection element is formed on the same semiconductor substrate as the protected circuit to protect the protected circuit.

The protection element includes two diodes. The diodes have their anodes connected together to form a floating node. The diodes have two cathodes connected to the protected circuit. These two diodes are formed in a well-in-well structure on the semiconductor substrate.

The well-in-well structure includes a P-type well forming the floating gate, an N-type well and a first N-type region. The N-type well surrounds the surfaces of the P-type well other than that on the front side of the substrate with the deep portion side of the substrate, thus forming the cathode of one of the diodes. The first N-type region is formed in the P-type well, forming the cathode of the other diode.

A semiconductor integrated circuit according to a second mode of the present invention includes a signal input terminal and at least one protection element. An input signal is applied to the signal input terminal. The protection element is connected between at least one of voltage supply terminals of source and reference voltages and the input terminal. The semiconductor integrated circuit further includes a protected circuit which is connected to the input terminal via a coupling capacitance.

The protected circuit and protection element are formed on the same semiconductor substrate.

The protection element includes two diodes. The diodes have their anodes connected together to form a floating node. The diodes have two cathodes connected to the protected circuit.

These two diodes are formed in a well-in-well structure on the semiconductor substrate.

The well-in-well structure includes a P-type well forming the floating gate, an N-type well and a first N-type region. The N-type well surrounds the surfaces of the P-type well other than that on the front side of the substrate with the deep portion side of the substrate, thus forming the cathode of one of the diodes. The first N-type region is formed in the P-type well, forming the cathode of the other diode.

In the above configuration according to the embodiments of the present invention, the protection element is formed with two diodes connected in a so-called back-to-back configuration in which the anodes of the diodes are connected together. Therefore, the protection element is equivalent in capacitance to two PN junction capacitances connected in series. As a result, the capacitance of this protection element is significantly smaller than that of GGMOS and other types of protection elements whose gate capacitance affects the input signal.

The protection element is connected between at least one of voltage supply terminals of source and reference voltages and the input terminal of the protected circuit, for example, as in the second mode.

In the first and second modes, the common anode of the two diodes forms a floating node. Therefore, if the voltage applied to the protection element increases steeply due, for example, to the application of a surge, the potential of the common anode will also increase steeply, turning ON one of the diodes depending on the potential of the location to which the common anode is connected. This turns ON an NPN-type parasitic bipolar transistor, steeply reducing the impedance of the protection element from this moment onward and rapidly eliminating the surge.

Further, in the second mode, the input terminal is connected to the input of the protected circuit via a coupling capacitance. As a result, a surge from the input terminal is applied directly to the protection element. The protection element is a bidirectional diode protection element. Therefore, even in the event of a variation of the DC level of the input terminal, the input signal remains undistorted over a more or less large voltage range.

BRIEF DESCRIPTION OF THE DRAWINGS

FIG. 2 is a configuration diagram, more detailed than that shown in FIG. 1, which includes an equivalent circuit of a protection element;

FIGS. 7A and 7B are a plan view and cross-sectional view of the protection element of a semiconductor integrated circuit according to a fifth embodiment;

FIGS. 12A to 12F are cross-sectional views of manufacturing process steps for forming the structure shown in FIGS. 11A and 11B;

FIGS. 14A and 14B are a plan view and cross-sectional view of a modification example of the protection element shown in FIGS. 7A and 7B (example associated with FIG. 9C);

DETAILED DESCRIPTION OF THE PREFERRED EMBODIMENTS

Embodiments of the present invention provide a semiconductor integrated circuit having a protection element with a small parasitic capacitance for preventing or suppressing signal wave distortion.

Figure 1:
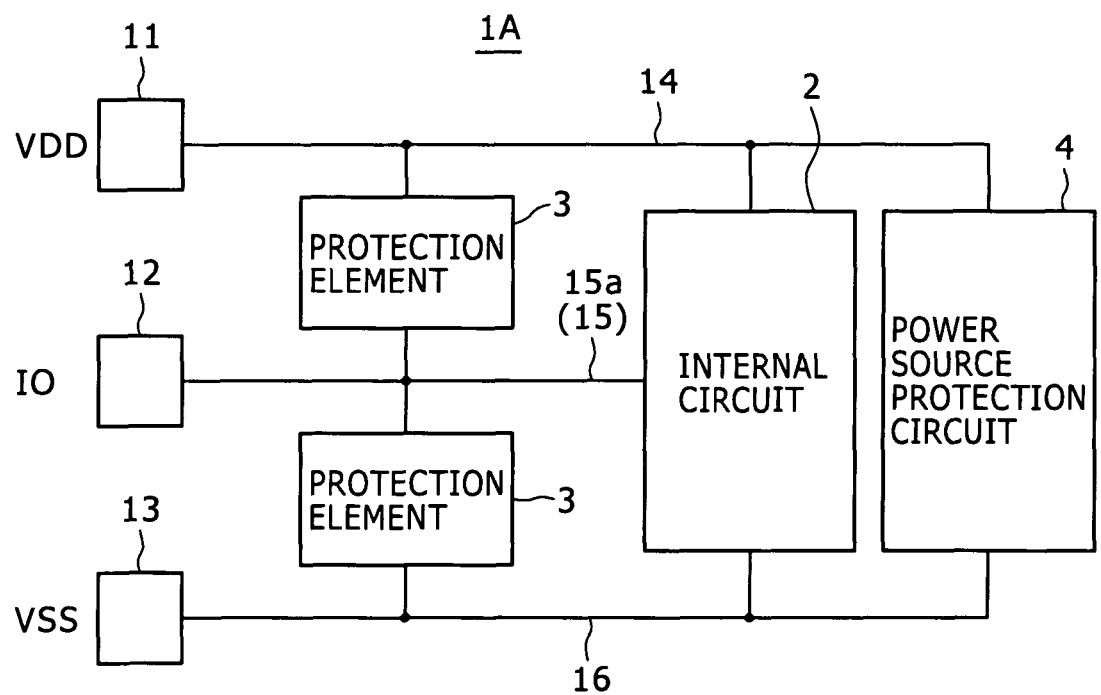
FIG. 1 is a configuration diagram of main components of a semiconductor integrated circuit according to a first embodiment.

The preferred embodiments of the present invention will be described below. The description will be given in the following order:
1. First embodiment: Two protection elements provided, one on the VDD side and another on the VSS side
2. Second embodiment: Protection element provided only on the VSS side
3. Third embodiment: Protection element provided only on the VDD side
4. Fourth embodiment: Example 1 of the cross-sectional structure (MOS gate used as an ion injection mask)
5. Fifth embodiment: Example 2 of the cross-sectional structure (MOS gate not used)
6. Sixth embodiment: Tuner circuit (example of application circuit)
7. Modification examples
8. Comparative examples and effects of the embodiments 1. First Embodiment FIG. 1 is a configuration diagram of main components of a semiconductor integrated circuit according to a first embodiment. FIG. 2 illustrates the protection element represented by an equivalent circuit in the configuration diagram of FIG. 1.

A semiconductor integrated circuit 1A shown in FIG. 1 includes an internal circuit 2 serving as a "protected circuit" and three terminals electrically connected to the internal circuit 2.

Here, the three terminals are a supply terminal of the source voltage VDD (VDD terminal 11), IO terminal 12 and a supply terminal of the reference voltage VSS (VSS terminal 13).

The source voltage VDD has a positive level of, for example, 1 to 5 V. The same voltage VDD is supplied, for example, from a source external to the semiconductor integrated circuit 1A. The same voltage VDD is applied from the VDD terminal 11 to the internal circuit 2 via the VDD line 14.

The reference voltage VSS is, for example, a 0 V ground voltage. The same voltage VSS is supplied, for example, from a source external to the semiconductor integrated circuit 1A. The same voltage VSS is applied from the VSS terminal 13 to the internal circuit 2 via the VSS line 16.

The IO terminal 12 is connected to a wiring 15 which is connected to the internal circuit 2. The wiring 15 is preferably a signal line, and more preferably a signal input or output line.

Here, we assume that the wiring 15 is, for example, a "signal input line." The signal input line will be hereinafter denoted by reference numeral 15a.

Two protection elements 3 are connected, one between the wiring 15 and VDD line 14, and another between the wiring 15 and VSS line 16. The protection elements 3 have a bidirectional diode configuration as described later. Therefore, these elements 3 are referred to as "bidirectional diode protection elements."

A potential difference exists or develops during operation between the two wirings to which each of the protection elements 3 is connected. This potential difference is applied to the internal circuit 2. The protection elements 3 are each connected between two wirings which could damage the internal circuit 2 as a result of the increase in potential difference therebetween.

A signal input line, in particular, is often located in proximity to a conductive layer of the circuit via a thin transistor gate insulating film or other insulating film which could be damaged. As a result, electric breakdown of the thin insulating film has to be prevented. The signal input line 15a will be hereinafter used as an example of the wiring 15 connected to the protection element 3.

It should be noted that if the VDD, IO and VSS terminals 11, 12 and 13 are external terminals, these terminals may be so-called electrode pads formed on the semiconductor integrated circuit (chip) 1A. Further, the same terminals 11 to 13 may be external terminals (e.g., external leads) of a product having the semiconductor integrated circuit (chip) 1A packaged therein.

Alternatively, the VDD, IO and VSS terminals 11, 12 and 13 may be regarded as internal terminals (nodes) provided at the subsequent stage of other internal circuit of the chip.

As illustrated in FIG. 2, the protection elements 3 each include two diodes D1 and D2 which have their anodes connected together in series facing opposite directions. Such a connection is referred to a back-to-back diode connection.

In FIG. 2, the diodes D1 and D2 making up the protection element 3 are also respectively denoted by parasitic capacitances Cp1 and Cp2. The parasitic capacitances Cp1 and Cp2 are primarily PN junction capacitances. Because the parasitic capacitances Cp1 and Cp2 are primarily two PN junction capacitances connected in series, the combined capacitance thereof is small.

The common anode of the diodes D1 and D2 (connection midpoint between the parasitic capacitances Cp1 and Cp2) forms a "floating gate." Therefore, the common anode is preferably not connected to any portion (terminal or wiring) of a fixed potential such as the VDD, IO or VSS terminal 11, 12 or 13. As a result, the common anode of the diodes D1 and D2 is maintained in an electrically floating condition.

One of the two cathodes of the diodes D1 and D2 includes an N-type well formed on a semiconductor substrate or a portion electrically connected to the N-type well.

The common anode includes a P-type well enclosed by an N-type well. Here, the term "a well enclosed by other well" refers to the fact that the surfaces of the well other than that on the front side of the semiconductor substrate are surrounded by the other well. In the present example, therefore, the P well can serve as a floating node because the independence thereof in terms of potential is ensured from portions maintained at the substrate potential or other fixed potential.

The other of the two cathodes of the diodes D1 and D2 includes an N-type region formed in the P-type well.

In FIG. 1, a power source protection circuit 4 is connected between the VDD line 14 and VSS line 16 as an arbitrary configuration.

The power source protection circuit 4 remains OFF when the potential difference between the source voltage VDD and reference voltage VSS is steady. A steady potential difference is, for example, 1 to 5 V with the source voltage VDD at 1 to 5 V and the reference voltage VSS at 0 V. However, the power source protection circuit 4 turns ON when the potential difference therebetween reaches a level considered sufficiently larger than 1 to 5V.

Here, a GGMOS, SCR (thyristor) or RC clamping circuit can be used as the power source protection circuit 4. On the other hand, the power source protection circuit 4 is commonly connected to the IO terminal 12 via a VDD-side and VSS-side bus resistances.

The operation of the protection element 3 on a standalone basis will be described in detail in other embodiments. The same element 3 can pass a surge current in both directions thanks to its diodes connected in a back-to-back configuration.

The protection element 3 according to the first embodiment has only a small capacitance of its own. This keeps the load capacitance of the signal input line 15a of the internal circuit 2 down to a minimum.

Further, even if the DC level of the signal fed to the IO terminal 12 changes over a wide range from the source voltage VDD to the reference voltage VSS, the input signal is clipped by the protection element 3, thus suppressing distortion of the waveform.

When the signal DC level is at the source voltage VDD, the voltage range over which the waveform remains free from distortion is equal to or lower than the range obtained by adding the backward withstand voltage of the diode D2 to the source voltage VDD. On the other hand, when the signal DC level is at the reference voltage VSS, the voltage range over which the waveform remains free from distortion is equal to or higher than the range obtained by subtracting the backward withstand voltage of the diode D1 from the reference voltage VSS.

It should be noted that if there is a need to expand the voltage range over which the waveform remains free from distortion, a desired number of diodes facing the same direction may be connected in series to either or both of the diodes D2 and D1.

Further, if the two protection elements 3 are provided for the signal input line 15a, one on the VDD side and another on the VSS side, the inner circuit can be protected without the medium of the power source protection circuit 4. This eliminates the need to consider the bus resistances of the VDD and VSS lines 14 and 16. The VDD and VSS lines 14 and 16 are a surge path passing via the power source protection circuit.

It should be noted, however, that this embodiment is disadvantageous as compared to the embodiments described later having the protection element 3 only on one side in that the parasitic capacitance is twice as large.

2. Second Embodiment

Figure 3:
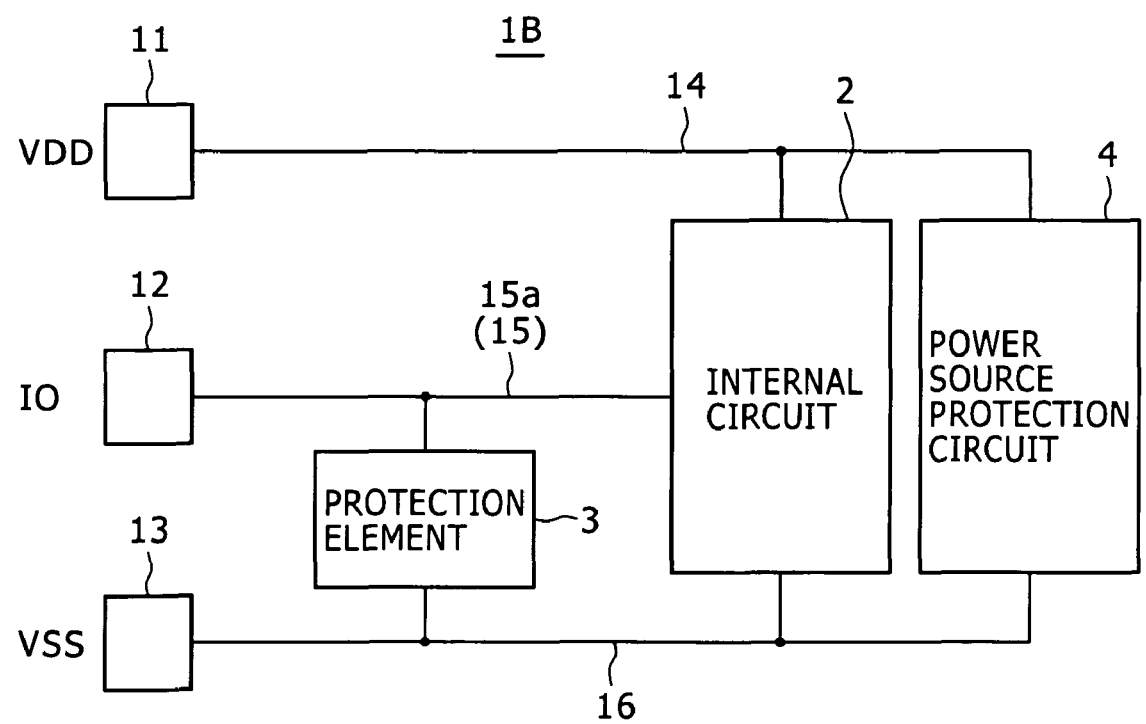
FIG. 3 is a configuration diagram of main components of a semiconductor integrated circuit according to a second embodiment.

FIG. 3 illustrates main components of a semiconductor integrated circuit according to a second embodiment.

As in FIG. 1, a semiconductor integrated circuit 1B shown in FIG. 3 includes the internal circuit 2 serving as a "protected circuit," power source protection circuit 4, VDD terminal 11, IO terminal 12, VSS terminal 13, VDD line 14, wiring 15 (e.g., signal input line 15a) and VSS line 16. Here, the power source protection circuit 4 is an arbitrary component in the first embodiment. However, the same circuit 4 is desired in the second embodiment to ensure more complete protection.

The semiconductor integrated circuit 1B shown in FIG. 3 differs from the semiconductor integrated circuit 1A shown in FIG. 1 in that the protection element 3 is connected between the wiring 15 and VSS line 16, but none between the wiring 15 and VDD line 14.

The semiconductor integrated circuit 1B is identical to the semiconductor integrated circuit 1A in all other respects.

The circuit operation will be described below with reference to FIG. 3.

The operation of the protection element 3 on a standalone basis is described here simply as "being capable of passing a surge current in both directions," and a detailed description thereof will be given later in the other embodiments.

We assume now that a positive or negative surge relative to the potential of the VSS line 16 (reference voltage VSS) is applied to the wiring 15 (hereinafter exemplified by the signal input line 15a).

In this case, the operation of the protection element 3 on a standalone basis, namely, "passing a surge current in both directions," is applicable in an as-is manner.

We conversely assume that a positive surge relative to the potential of the VDD line 14 (source voltage VDD) is applied to the signal input line 15a.

In this case, the circuit operation includes two process steps. One of the process steps is to apply a positive surge relative to the potential of the VSS line 16 (reference voltage VSS) to the signal input line 15a. The other process step is to pass a surge current through the path passing via the power source protection circuit 4.

That is, a surge current flows from the signal input line 15a, through the protection element 3, VSS line 16 and power source protection circuit 4, to the VDD line 14 and VDD terminal 11 and finally to the outside of the circuit.

On the other hand, we assume that a negative surge relative to the potential of the VDD line 14 (source voltage VDD) is applied to the signal input line 15a.

In this case, a surge current flows from the VDD line 14, through the power source protection circuit 4, VSS line 16, protection element 3 and signal input line 15a, to the IO terminal 12 and finally to the outside of the circuit.

In the second embodiment, the protection element 3 offers low capacitance as its advantage as in the first embodiment.

In the second embodiment, the protection element 3 is formed only on one side of the signal input line 15a (rather than on both sides thereof). This keeps the load capacitance of the signal input line 15a to a level even lower than in the first embodiment.

It should be noted, however, that the protection element 3 itself connected on the side of the reference voltage VSS may not suppress the distortion of the signal amplitude greater than the source voltage VDD. Therefore, the power source protection circuit 4 should be configured to be able to suppress the distortion of the signal amplitude greater than the source voltage VDD.

3. Third Embodiment

Figure 4:
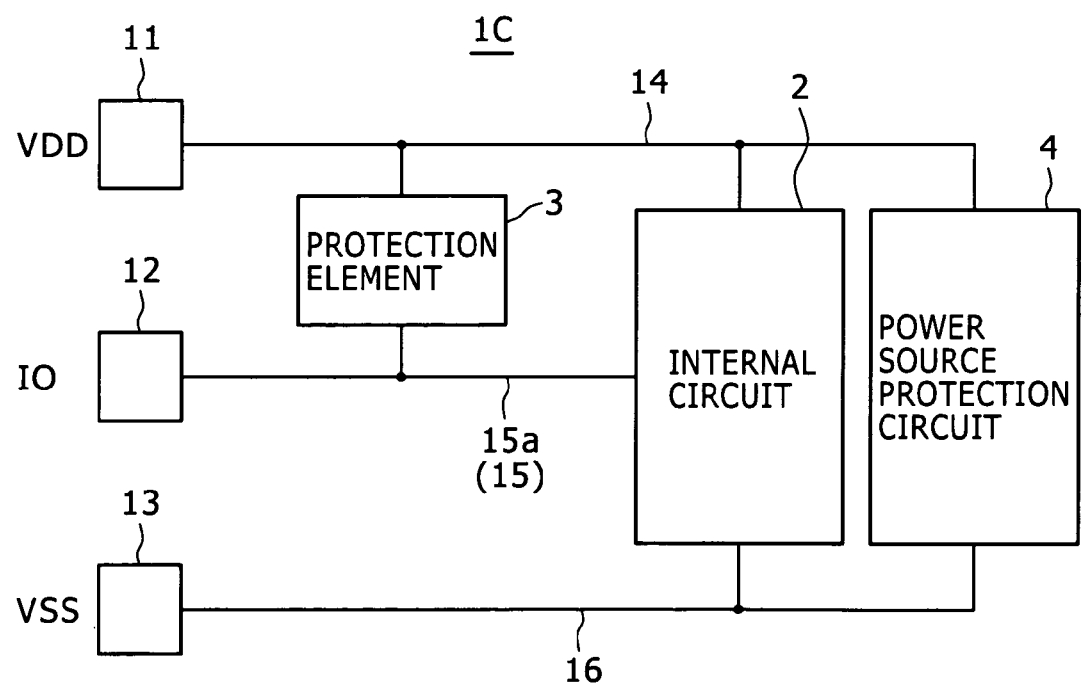
FIG. 4 is a configuration diagram of main components of a semiconductor integrated circuit according to a third embodiment.

FIG. 4 illustrates main components of a semiconductor integrated circuit according to a third embodiment.

As in FIG. 1, a semiconductor integrated circuit 1C shown in FIG. 4 includes the internal circuit 2 serving as a "protected circuit," power source protection circuit 4, VDD terminal 11, IO terminal 12, VSS terminal 13, VDD line 14, wiring 15 (e.g., signal input line 15a) and VSS line 16. Here, the power source protection circuit 4 is an arbitrary component in the first embodiment. However, the same circuit 4 is desired in the third embodiment to ensure more complete protection.

The semiconductor integrated circuit 1C shown in FIG. 4 differs from the semiconductor integrated circuit 1A shown in FIG. 1 in that the protection element 3 is connected between the wiring 15 and VDD line 14, but none between the wiring 15 and VSS line 16.

The semiconductor integrated circuit 1C is identical to the semiconductor integrated circuit 1A in all other respects.

The circuit operation will be described below with reference to FIG. 4.

The operation of the protection element 3 on a standalone basis is described here simply as "being capable of passing a surge current in both directions," and a detailed description thereof will be given later in the other embodiments.

We assume now that a positive or negative surge relative to the potential of the VDD line 14 (source voltage VDD) is applied to the wiring 15 (hereinafter exemplified by the signal input line 15a).

In this case, the operation of the protection element on a stand-alone basis, namely, "passing a surge current in both directions," is applicable in an as-is manner.

We conversely assume that a positive surge relative to the potential of the VSS line 16 (reference voltage VSS) is applied to the signal input line 15a.

In this case, the circuit operation includes two process steps. One of the process steps is to apply a positive surge relative to the potential of the VDD line (source voltage VDD) to the signal input line 15a. The other process step is to pass a surge current through the path passing via the power source protection circuit 4.

That is, a surge current flows from the signal input line 15a, through the protection element 3, source voltage VDD and power source protection circuit 4, to the VSS line 16 and VSS terminal 13 and finally to the outside of the circuit.

On the other hand, we assume that a negative surge relative to the potential of the VSS line 16 (reference voltage VSS) is applied to the signal input line 15a.

In this case, a surge current flows from the VSS line 16, through the power source protection circuit 4, VDD line 14, protection element 3 and signal input line 15a, to the IO terminal 12 and finally to the outside of the circuit.

In the third embodiment, the protection element 3 offers low capacitance as its advantage as in the first embodiment.

In the third embodiment, the protection element 3 is formed only on one side of the signal input line 15a (rather than on both sides thereof). This keeps the load capacitance of the signal input line 15a to a level even lower than in the first embodiment.

It should be noted, however, that the protection element 3 itself connected on the side of the source voltage VDD may not suppress the distortion of the signal amplitude smaller than the reference voltage VSS. Therefore, the power source protection circuit 4 should be configured to be able to suppress the distortion of the signal amplitude smaller than the reference voltage VSS.

The features of the present invention which are manifested in the first to third embodiments can be itemized as follows:

(1) The semiconductor integrated circuit includes the protected circuit (internal circuit 2) and protection element 3. The protection element 3 is formed on the same semiconductor substrate as the protected circuit to protect the protected circuit.

(2) The protection element 3 includes the two diodes D1 and D2. The diodes D1 and D2 have their anodes connected together to form a floating gate. The diodes have two cathodes connected to the protected circuit.

(3) The two diodes D1 and D2 are formed in a well-in-well structure on the semiconductor substrate.

(4) The well-in-well structure described in item (3) includes a P-type well forming the floating gate described in item (2), an N-type well and a first N-type region. The N-type well encloses the P-type well, forming the cathode of one of the diodes. The first N-type region is formed in the P-type well, forming the cathode of the other diode.

The embodiments given below are intended to illustrate more concrete structures than those in the most fundamental first to third embodiments.

One of the features common to the embodiments given below relates to the well-in-well structure which was expressed only in words in the first to third embodiments. That is, the well-in-well structure can be formed simultaneously with the structure of a CMOS transistor (example of a complementary MIS transistor) formed in the semiconductor integrated circuits 1A to 1C. As a result or evidence of the simultaneous formation, the two well-in-well structures have the same structural parameters other than the two-dimensional pattern, namely, the same structure of the impurity region (depth and impurity profile) along the depth.

4. Fourth Embodiment

Figure 5A:
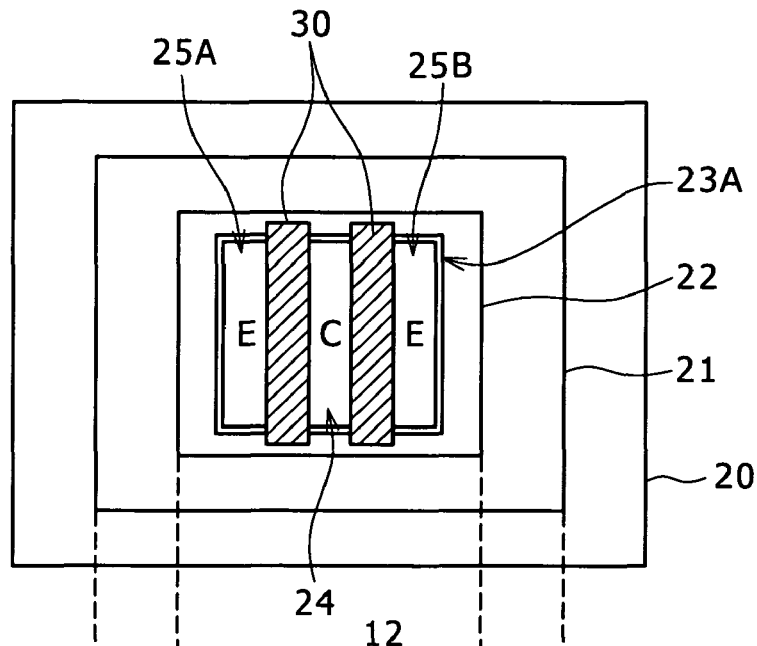
FIGS. 5A and 5B are a plan view and cross-sectional view of the protection element of a semiconductor integrated circuit according to a fourth embodiment.
Figure 5B:
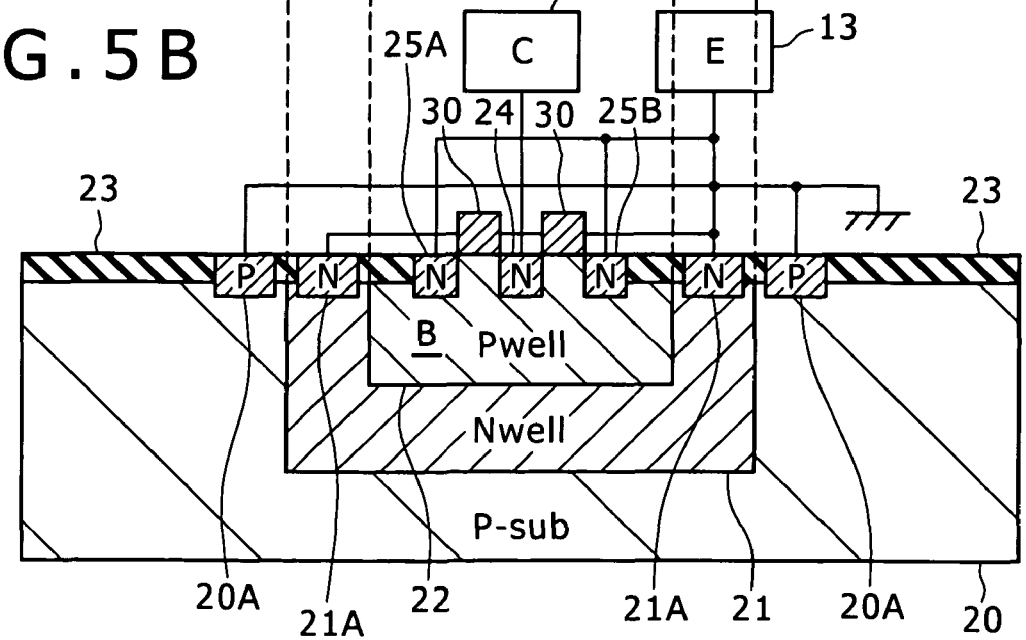

FIGS. 5A and 5B illustrate a plan view and cross-sectional view of main components of a semiconductor integrated circuit 1D according to a fourth embodiment. FIGS. 5A and 5B illustrate the protection element 3 shown in FIG. 1 or 3 which is connected between the VSS line 16 and wiring 15. The protection element 3 on the VDD side is basically identical except for some wirings which are different in type.

The element structure according to the fourth embodiment will be described below with reference to FIGS. 5A and 5B.

An N-type well 21 is formed in a P-type semiconductor substrate (P-Sub) 20. A P-type well 22 is formed in the N-type well 21. The P-type well 22 is enclosed by the N-type well 21.

An element isolation layer 23 is formed on the front surface of the semiconductor substrate 20 having a well-in-well structure formed as described above. The element isolation layer 23 has an opening portion 23A. The opening portion 23A is widely open roughly at the center of the protection element forming region as illustrated in FIG. 5A. Other opening portions of the element isolation layer 23 are small ones for substrate contact and well contact. Therefore, these opening portions are not shown in FIG. 5A.

The element isolation layer 23 includes a LOCOS (Local Oxidation of Silicon) or STI (Shallow Trench Isolation) layer.

As illustrated in FIG. 5B, a P-type substrate contact region 20A is formed in the semiconductor substrate 20 via the opening portion provided in the element isolation layer 23. The substrate contact region 20A is a P-type impurity region having a higher concentration than the semiconductor substrate 20.

Similarly, an N-type N well contact region 21A is formed in the N-type well 21 via the opening portion provided in the element isolation layer 23. The N well contact region 21A is an N-type impurity region having a higher concentration than the N-type well 21.

As illustrated in FIG. 5A, two gate electrodes 30 intersect the opening portion 23A. The two gate electrodes 30 each have a rectangular two-dimensional pattern and are arranged parallel to each other along the width of the shorter sides with a given distance therebetween. It should be noted that although the gate electrodes 30 are opposed to the P-type well 22 via a thin gate insulating film, the gate insulating film is not shown in FIG. 5B.

The opening portion 23A is partitioned into three rectangular regions by the two gate electrodes 30. These three rectangular regions are doped with an N-type impurity of high concentration. This allows for a first N-type region 24 in the center and two second N-type regions 25A and 25B on both sides to be formed in the P-type well 22.

The first N-type region 24 is connected to the IO terminal 12. The second N-type regions 25A and 25B are connected to the reference voltage or GND voltage here together with the substrate contact region 20A and N well contact region 21A, thus allowing these regions to be grounded. This grounding is achieved by connection of these regions to the VSS terminal 13.

In FIG. 5B, reference numeral C represents the collector of a parasitic bipolar transistor which turns ON when the voltage vs. current characteristic of the protection element according to the first embodiment snaps back. At this time, the first N-type region 24 serves as a collector region.

Reference numeral E represents the emitter of the parasitic bipolar transistor. At this time, the second N-type regions 25A and 25B function as emitter regions of a lateral NPN-type bipolar transistor.

Further, reference numeral B represents the base of the parasitic bipolar transistor. At this time, the P-type well 22 functions as a base region. Because the potential of the base region (P-type well 22) is not fixed, the same region forms a floating node, which is important for the bipolar operation.

Here, as for the correspondence between the back-to-back connection of the two diodes and the PN junction surface in the cross-sectional element structure and modification examples thereof, a description will be given later in a fifth embodiment.

The parasitic bipolar transistor is not limited to a lateral NPN-type bipolar transistor, but may be a vertical NPN-type transistor. It should be noted, however, that the parasitic bipolar transistor should preferably be a lateral NPN-type bipolar transistor having the emitter region (second N-type regions 25A and 25B) disposed in proximity to but at a given distance from the collector region (first N-type region 24). The reason for this is that the element characteristics can be readily controlled by the concentrations of the emitter and collector regions and the distance between the two regions.

Further, the semiconductor integrated circuit shown in FIGS. 5A and 5B is defined in that, in the protection element forming region, the gate electrodes 30 which can be simultaneously formed in a complementary MIS (e.g., CMOS) transistor are used as N-type impurity ion injection masks adapted to form the first N-type region 24 and second N-type regions 25A and 25B. The gate electrodes 30 are provided not merely for the protection element. This eliminates the need to provide any additional photomask for forming an ion injection mask or add any process steps therefor, thus ensuring low cost and high positional accuracy in the ion injection.

Figure 6:
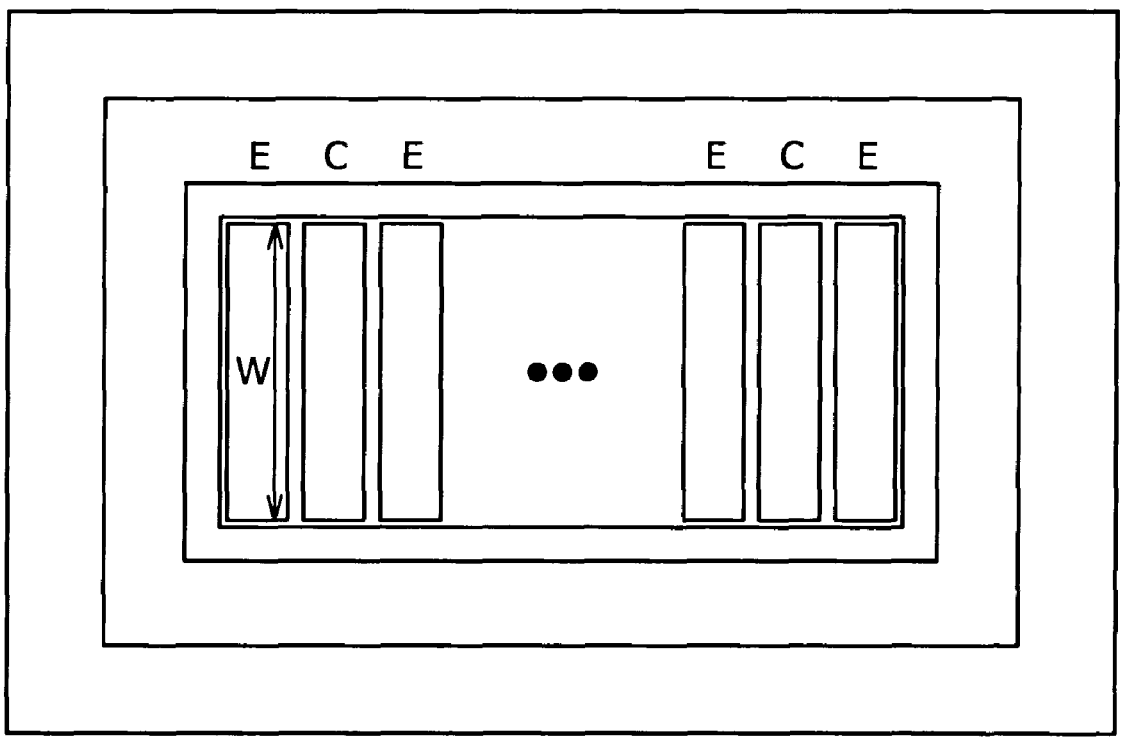
FIG. 6 is a generalized diagram of the arrangement of an emitter E and collector C shown in FIGS. 5A and 5B.

Although mention will be also made in other embodiments, the impurity region serving as the collector C (first N-type region 24 shown in FIG. 5B) and those serving as the emitter E (N-type regions 25A and 25B shown in FIG. 5B) are arranged alternately as shown in FIG. 6. This arrangement of the impurity regions permits the formation of a protection element having large current driving capability although occupying a small space.

This arrangement of the impurity regions is the same as that of the source and drain regions formed in a MOSFET having a multi-finger gate structure. As a result, the impurity regions having this arrangement can be formed together with the CMOS transistor in a single step.

To ensure improved electrical characteristics, reliability and stability of the protection element, it is important that a current should not flow in a concentrated manner through a specific local area. The pattern shown in FIG. 6 similar to a multi-finger gate structure is preferred also in terms of distribution of current flow paths.

The operation of the protection element having the above configuration will be described below.

We assume that a voltage relative to one of the N-type region and N-type well is applied to the other thereof and that the voltage is increased. Here, the lower of the N-type region and N-type well in potential is referred to as the source (or emitter) and the higher thereof the drain (or collector).

As the applied voltage is increased, a depletion layer extends on both sides of the metallurgical junction position between the drain and P-type well and between the source and P-type well. Further, a channel is formed in the portion of the P-type well 22 between the source and drain because of the electric field of the gate connected to the source.

The majority carriers (electrons) of the source flow through the channel and also pass through the substrate, gaining high energy in the drain and colliding with silicon crystals. In particular, a reverse bias is applied between the first N-type region 24 serving as the drain region and the P-type well 22, causing impact ionization as a result of collision of the charge accelerated by a high electric field. The impact ionization produces electron-hole pairs. Of the electron-hole pairs, the electrons are primarily absorbed by the first N-type region 24. On the other hand, the holes are scattered in the P-type well 22 and attracted toward the second N-type regions 25A and 25B. This raises the potential of the P-type well 22. As a result, the PN junction between the P-type well 22 and second N-type regions 25A and 25B is forward-biased.

From this moment, a parasitic bipolar transistor turns ON. This transistor has one of the N-type well and N-type region as its emitter, the P-type well as its base and the other of the N-type well and N-type region as its collector.

When the parasitic bipolar transistor turns ON, the emitter-to-collector impedance will decline steeply, causing the voltage vs. current characteristic of the protection element to snap back. After the characteristic snaps back, the current channel changes to low resistance, allowing the surge current to flow efficiently from this point onward. This provides the protection element with improved capability to eliminate surge, thus ensuring stable operation of the circuit.

This operation is similarly performed if the surge polarity is reversed. In this case, the source and drain reverse their functions.

Here, a positive or negative surge relative to the potential of the source (emitter E) is applied to the drain (collector C). In either case, the parasitic NPN-type bipolar transistor is activated after the snap-back following the impact ionization, allowing for the protected circuit (internal circuit 2) to be clamped at low voltage and protected.

It should be noted that the physical phenomenon behind this operation, and the generation of charge leading to the increase in potential of the P-type well in particular, is not limited to impact ionization.

For example, as described later, if, particularly, the gate electrode is omitted, the carriers may be injected into the P-type well 22 as a result of avalanche breakdown of the drain end, thus raising the potential thereof. It should be noted, however, that avalanche breakdown may occur predominantly even in the presence of a gate electrode.

Alternatively, the increase in potential of the P-type region may be caused by a combination of factors, including impact ionization followed by avalanche breakdown.

It should be noted that the operations associated with the three cases described in the first to third embodiments with reference to FIGS. 1, 3 and 4 are applicable in an as-is manner to the circuit operation itself.

5. Fifth Embodiment

FIGS. 7A and 7B illustrate a plan view and cross-sectional view of main components of a semiconductor integrated circuit 1E according to a fifth embodiment. FIGS. 7A and 7B illustrate the protection element 3 shown in FIG. 1 or 3 which is connected between the VSS line 16 and wiring 15. The protection element 3 on the VDD side is basically identical except for some wirings which are different in type.

The element structure according to the fifth embodiment shown in FIGS. 7A and 7B differs from that shown in FIGS. 5A and 5B in that the gate electrodes 30 shown in FIGS. 5A and 5B are not provided in the element structure shown in FIGS. 7A and 7B.

In the fourth embodiment shown in FIGS. 5A and 5B, the overlay accuracy of the gate electrodes 30 on the opening portion 23A is determined by the alignment accuracy of the exposure system. As a result, impurity regions are arranged in a self-aligned manner relative to the gate electrodes 30.

In contrast, in the fifth embodiment, opening portions are formed in the element isolation layer 23 to form the substrate contact region 20A and N well contact region 21A. At the same time, opening portions are formed in the element isolation layer 23 where the first N-type region 24 and second N-type regions 25A and 25B will be formed. As a result, the positions of the first N-type region 24 and second N-type regions 25A and 25B relative to each other are determined by the pattern of the photomask used to form the opening portions in the element isolation layer 23.

After the formation of the element isolation layer 23, the N-type impurity is ion-injected into the region denoted by reference numeral 23B in FIG. 7A or the region including where the N well contact region 21A is formed. Activation annealing completes the structure of the impurity regions shown in FIGS. 7A and 7B.

The manufacturing method described above ensures the same or higher accuracy in the positions of the first N-type region 24 and second N-type regions 25A and 25B relative to each other as compared to the fourth embodiment.

Figure 8A:
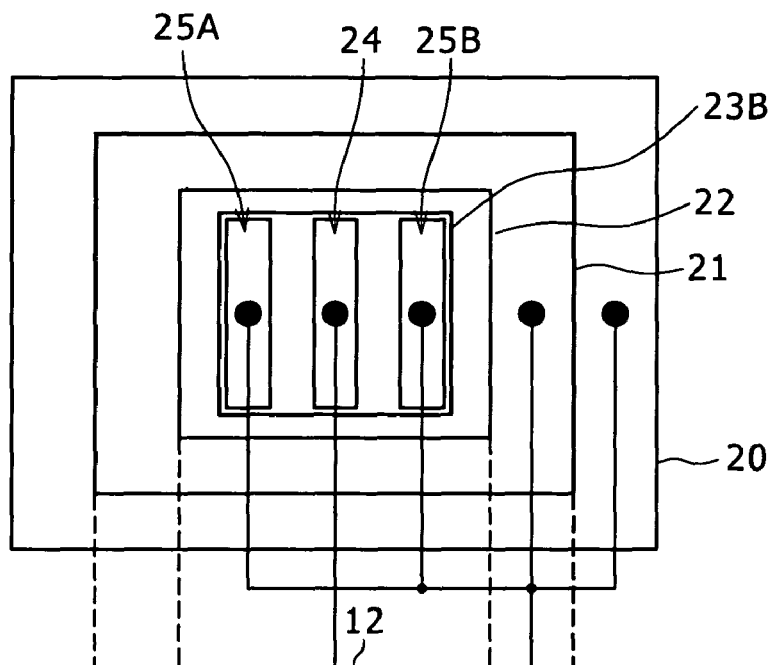
FIGS. 8A and 8B are a plan view and cross-sectional view showing diode symbols and connection lines in addition to FIGS. 7A and 7B.
Figure 8B:
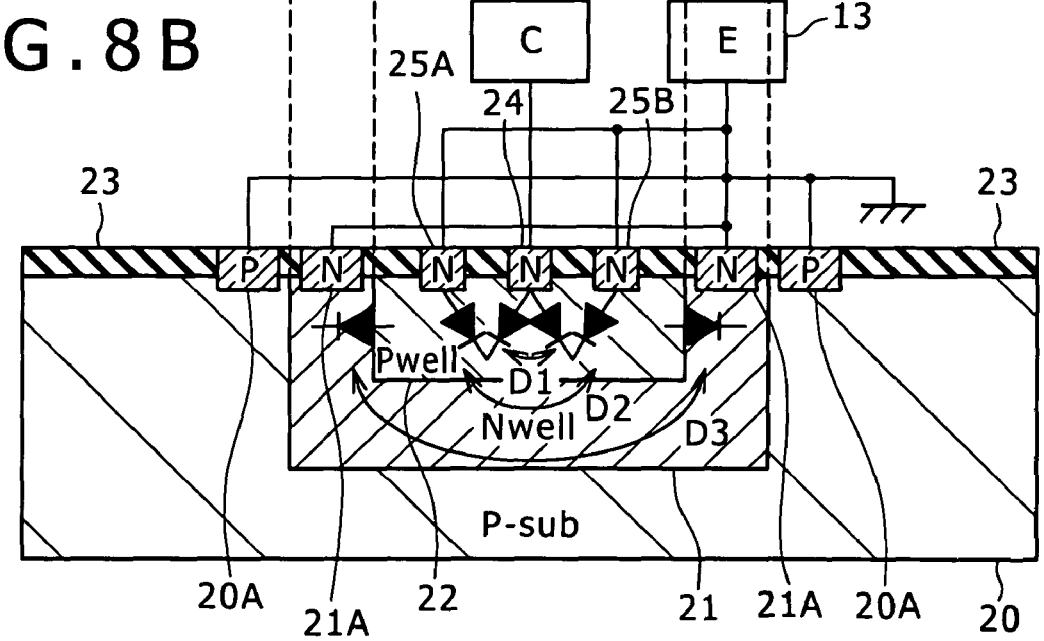
Figure 9A:
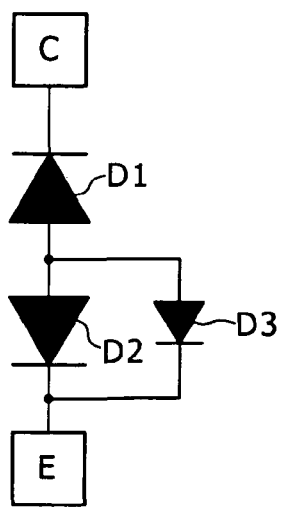
FIGS. 9A to 9C are equivalent circuit diagrams of the protection element of the fifth embodiment and modification examples thereof.

FIG. 8B is a cross-sectional configuration diagram illustrating parasitic elements not shown in FIG. 7B. FIG. 8A illustrates the details of connection not shown in FIG. 7A. FIG. 9A illustrates an equivalent circuit diagram of the protection element 3 shown in FIGS. 8A and 8B.

As illustrated in FIG. 8B, the diode D1 is formed by the PN junction between the first N-type region 24 and P-type well 22. The diode D2 is formed by two PN junctions, one between the second N-type region 25A and P-type well 22 and another between the second N-type region 25B and P-type well 22. Therefore, the diodes D1 and D2 are connected in a back-to-back configuration.

The P-type well 22 is enclosed by the N-type well 21. The N well contact region 21A adapted to supply the potential to the N-type well 21 is shorted with the second N-type regions 25A and 25B. Therefore, a diode D3 is connected in parallel to the diode D2 as a parasitic element.

This is shown in the form of a circuit diagram in FIG. 9A. As is clear from FIG. 9A, it can be said that the two diodes, one made up of a combination of the diodes D2 and D3 and another made up of the diode 1, are connected in a back-toback configuration. From this, it is certain that the protection element 3 includes two diodes whose anodes are connected together.

The operation of the protection element having the above configuration will be described below.

We assume that a voltage relative to one of the N-type region and N-type well is applied to the other thereof and that the voltage is increased. Here, the lower of the N-type region and N-type well in potential is referred to as the emitter and the higher thereof the collector.

As the applied voltage is increased, a depletion layer extends on both sides of the metallurgical junction position between the collector and P-type well and between the emitter and P-type well. Junction breakdown occurs at a given level of the applied voltage. Junction breakdown normally occurs on the emitter side which has a higher electric field.

Once junction breakdown occurs, a current flows from the collector through the base (P-type well) to the emitter. This raises the base potential (potential of the P-type well), forward-biasing the PN junction between the base and emitter.

From this moment, a parasitic bipolar transistor turns ON. This transistor has one of the N-type well and N-type region as its emitter, the P-type well as its base and the other of the N-type well and N-type region as its collector.

When the parasitic bipolar transistor turns ON, the emitter-to-collector impedance will decline steeply. This causes the voltage vs. current characteristic of the protection element to snap back. From this moment onward, a surge current flows efficiently. Further, after the snap-back, the electric field concentration on the collector side is relaxed. This permits distribution of the areas developing an avalanche breakdown, thus relaxing local temperature rise resulting from continuous avalanche breakdown at a specific location. This prevents the degradation of crystal quality resulting from local temperature rise, thus providing stable element characteristics.

It should be noted that the physical phenomenon behind this operation, and the generation of charge leading to the increase in potential of the P-type well in particular, is not limited to avalanche breakdown.

For example, as described later, if, particularly, a channel of the MIS transistor having a gate electrode is formed, the impact ionization produces electron-hole pairs. Of the electron-hole pairs, the holes may be accumulated in the P-type region, causing the potential of the P-type region to increase.

Alternatively, the increase in potential of the P-type region may be caused by a combination of factors, including impact ionization followed by avalanche breakdown.

It should be noted that the operations associated with the three cases described in the first to third embodiments with reference to FIGS. 1, 3 and 4 are applicable in an as-is manner to the circuit operation itself.

A description will be given next of a detailed example of the connection structure between the collector region (first N-type region 24) and emitter region (second N-type regions 25A and 25B) with reference to FIGS. 10 and 11.

Figure 10A:
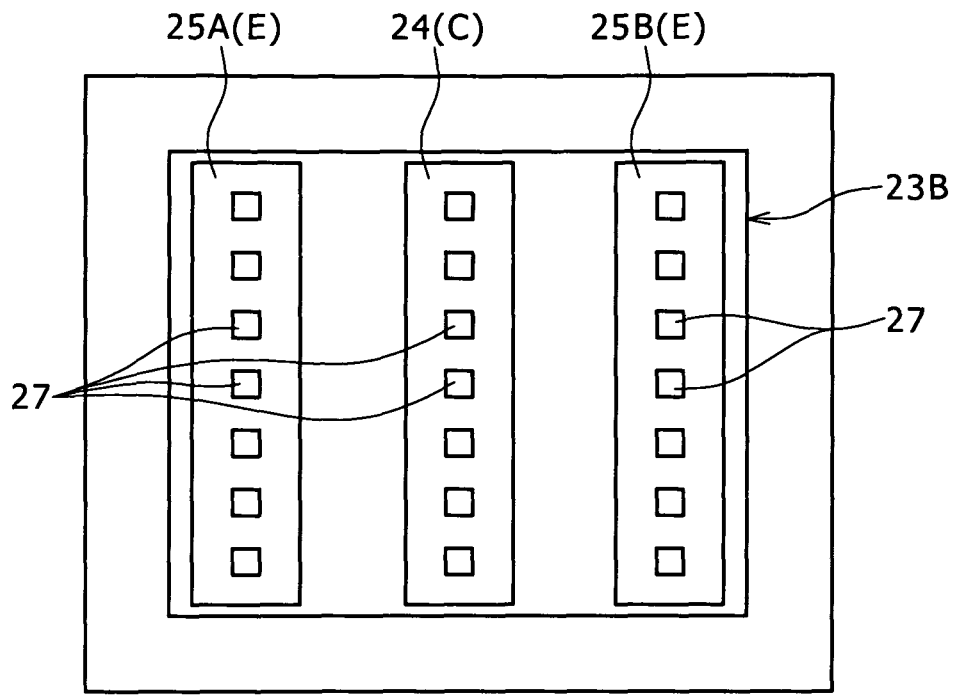
FIGS. 10A and 10B are an enlarged plan view and enlarged cross-sectional view of a connection portion in the fifth embodiment.
Figure 10B:
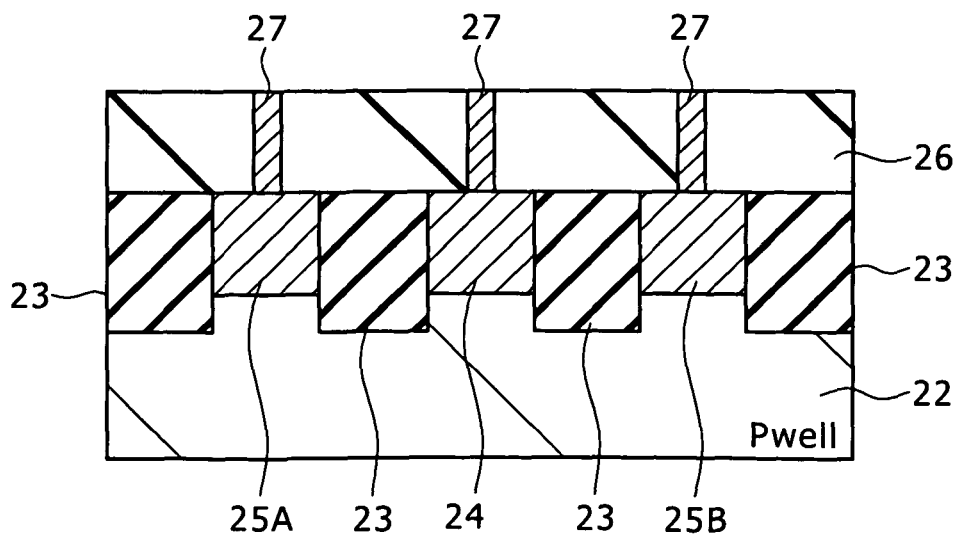

FIGS. 10A and 10B illustrate an enlarged plan view and enlarged cross-sectional view of a simple structure of the connection portion. In this structure, contact plugs are formed in the first N-type region 24 and second N-type regions 25A and 25B.

The opening portions of the element isolation layer 23 shown in FIG. 10B form three parallel rectangular patterns as shown in FIG. 10A, thus defining the shapes of the first N-type region 24 at the center and the second N-type regions 25A and 25B on both sides thereof. The first N-type region 24 and second N-type regions 25A and 25B are obtained by ion injection of an N-type impurity through these opening portions, namely, using the element isolation layer 23 as a self-aligned mask.

The upper surfaces of the first N-type region 24 and second N-type regions 25A and 25B are covered with an interlayer insulating film 26.

Figure 11A:
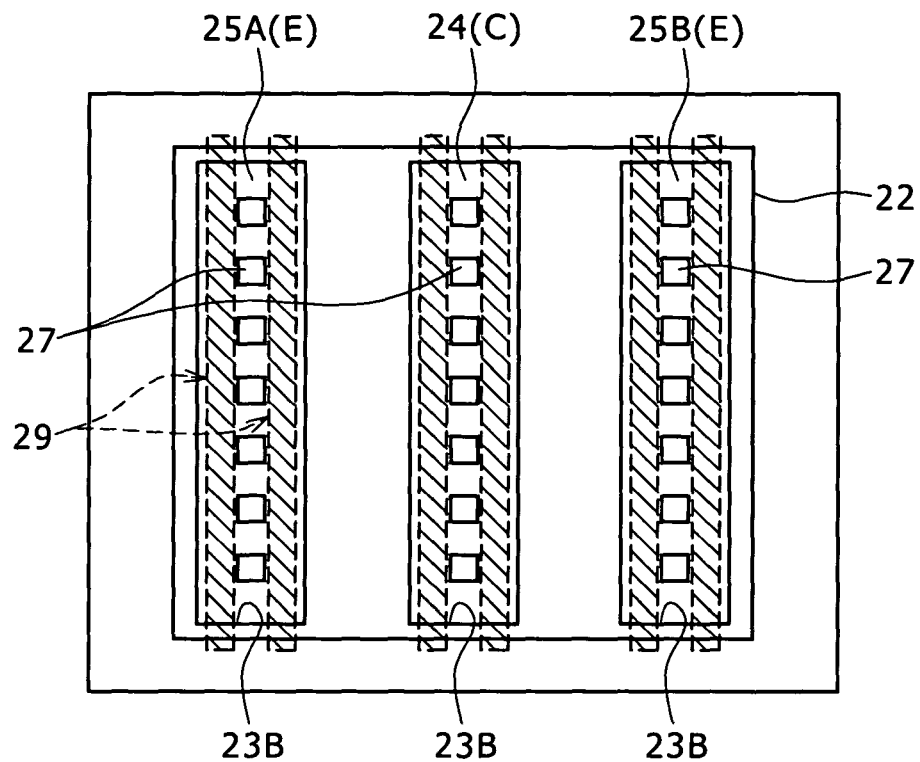
FIGS. 11A and 11B are an enlarged plan view and enlarged cross-sectional view of the silicided connection portion in the fifth embodiment.

A number of contact plugs 27 are embedded in the interlayer insulating film 26 (refer to FIG. 11A for the arrangement thereof). The lower surface of each of the contact plugs 27 is in contact with one of the first N-type region 24 and second N-type regions 25A and 25B.

It should be noted that, although not specifically illustrated, wirings are provided for each of the collector and emitter on the upper surface of the interlayer insulating film 26.

Figure 11B:
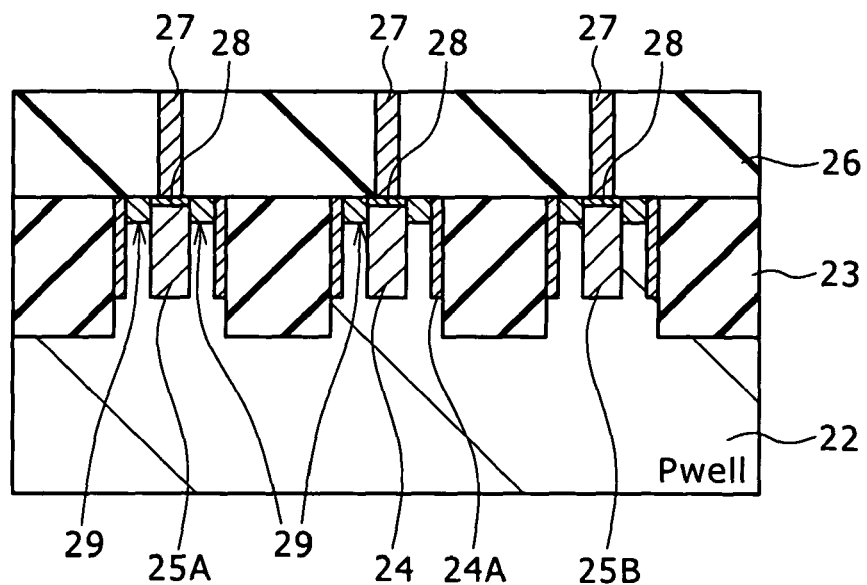

FIGS. 11A and 11B are a structure which permits distribution of the avalanche breakdown point of a diode by partially stopping the reduction in resistance with the silicide process.

In the complementary MIS (CMOS) process, the increase in resistance of the gate, drain and source as a result of the miniaturization of transistors hinders the high-speed operation. Therefore, a silicide process is often used which is designed to silicide the upper surfaces of the source and drain regions (and also that of the gate electrode).

In the embodiments of the present invention, it is preferred that the well-in-well structure of the protection element 3 formed simultaneously with that of the CMOS transistor should be used because this eliminates the need to add any process steps. Further, it is preferred that the first N-type region 24 and second N-type regions 25A and 25B should be formed together with the source and drain regions of the NMOS transistor in the CMOS transistor in a single step because this eliminates the need to add any process steps.

In this case, if a silicide process is included in the CMOS process, a silicide layer is formed in a single step also on the N-type region of the protection element 3.

On the other hand, a high electric field likely develops in the vicinity of the adjacent edges close to each other or in the vicinity of the corners of the N-type region on the deep side of the substrate between the first N-type region 24 and second N-type region 25A and between the first N-type region 24 and second N-type region 25B. It should be noted, however, that if a high electric field is by far more likely to develop at one location than any other locations, an avalanche breakdown continues to occur only at that location as the applied voltage is increased. This raises concern over possible degradation of the characteristics and quality due to heating.

In the present embodiment, therefore, the main and separated tip portions are connected together by resistive regions 29 in each of the first N-type region 24 and second N-type regions 25A and 25B as illustrated in FIG. 11B. The resistive regions 29 function as a resistance layer because some area of these regions remains undepleted when a voltage is applied. That is, the resistive regions 29 function as a so-called ballast resistor.

A more detailed description will be given below. In the description, the area in the vicinity of the first N-type region 24 on the side of the second N-type region 25A in FIG. 11B is taken as an example.

A positive voltage (e.g., surge) relative to the potential of the second N-type region 25A is applied to the first N-type region 24. In this case, avalanche breakdown is normally likely to develop first at the separated portion of the first N-type region 24 (separated tip N-type region 24A) which remains in the tip portion of the resistive region 29 closest to the second N-type region 25A.

At this time, the resistive region 29 in contact with the first N-type region 24 on the side of the second N-type region 25A does not become completely depleted. As a result, a current flows therethrough (electrically neutral region on the front side). In this case, the potential is determined relative to that of the second N-type region 25A. Therefore, the potential of the first N-type region 24 is raised by the voltage drop calculated by the current and resistance. This produces a condition in which avalanche breakdown likely develops also in the resistive region 29 and the main portion of the first N-type region 24, resulting in distribution of locations where avalanche breakdown develops.

In order to achieve such a distribution of avalanche breakdown, it is important that the resistive region 29 should not be completely depleted and that the same region 29 should be maintained at more or less high resistance.

However, if a normal silicide process is used in an as-is manner, a silicide layer 28 is also formed on the resistive region 29, making it difficult to provide the same region 29 with high resistance.

Therefore, silicide blocking regions in the shape of lines are formed in the areas shaded in FIG. 11A, including the upper surfaces of the resistive regions 29. More specifically, the silicide blocking regions are covered with an insulating film to prevent alloy reaction during silicide heating although described in detail later.

This keeps the ballast resistor function of the resistive regions 29 intact, making it possible to maintain the characteristics and quality of the protection element 3 at high levels.

FIGS. 12A to 12F illustrate cross-sectional views of the protection element during the manufacture according to the process flow.

FIG. 12A is a cross-sectional view after the formation of the element isolation layer 23. The same layer 23 is formed by a known method although the formation method varies depending on whether the same layer 23 is a LOCOS or STI layer.

In the process step shown in FIG. 12B, an N-type impurity is introduced into the surface of the P-type well 22 at a low concentration, thus forming the resistive regions 29. The P-type well 22 is exposed in the opening portions of the element isolation layer 23.

In the process step shown in FIG. 12C, an insulating film 28A of desired thickness is formed first over the entire surface. Then, a resist Re is formed on the insulating film 28A into a pattern appropriate to the silicide blocking regions shown in FIG. 11A.

In the process step shown in FIG. 12D, an N-type impurity is ion-injected using the resist Re as a mask. At this time, the portions of the insulating film 28A which become exposed around the resist Re function as a through film for ion injection. Then, etching using the resist Re as a mask removes the portions of the insulating film 28A which functioned as a through film.

In the process step shown in FIG. 12E, a metallic layer is deposited over the entire surface after the removal of the resist Re. Then, the metallic layer is silicided by thermal treatment. At this time, only the metallic layer on the silicon is silicided. Therefore, the silicide layer 28 is formed on the first N-type region 24 and separated tip N-type region 24A as shown in FIG. 12E. As a result, the silicide layer 28 is not formed on the resistive regions 29 covered with the insulating film 28A.

Then, the interlayer insulating film 26 is deposited as shown in FIG. 12F, thus forming the contact plugs 27.

The resistive regions 29 each play a role of a ballast resistor. Therefore, factors such as concentration and implantation energy (depth) thereof significantly affect the characteristics of the protection element. Further, it has been discovered from TEG evaluation that the concentration and other conditions of the resistive regions 29 significantly affect the characteristics of the protection element also in the high concentration N-type regions (e.g., separated tip N-type region 24A) connected, for example, to the main portions of the first N-type region 24 via the resistive regions 29 and located adjacent to the element isolation layer 23.

Thus, the conditions such as concentration and depth are important for designing the protection element in the structure having two high-concentration N-type regions (24 and 24A) connected by a low-concentration N-type region (resistive region 29).

The manufacturing method shown in FIG. 12 provides a process which keeps the arrangement of N-type impurity regions unaffected by silicidation. This arrangement has a large impact on the characteristics of the protection element.

6. Sixth Embodiment

Figure 13:
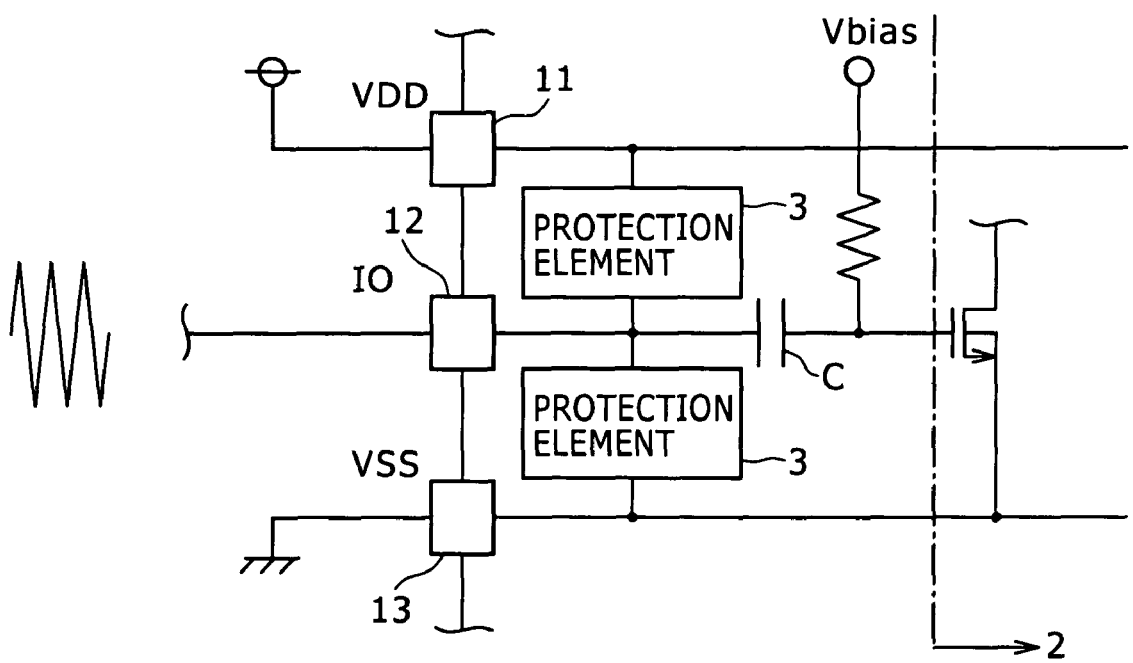
FIG. 13 is a configuration diagram of main components of a semiconductor integrated circuit according to a sixth embodiment.

FIG. 13 illustrates part of a semiconductor integrated circuit according to a sixth embodiment. The embodiment according to the sixth embodiment includes a circuit example which can be suitably implemented by the present invention. As for the configuration and structure of each of the protection elements 3 and the connection to the protected circuit, those described in the first to fifth embodiments can be combined as desired.

In the circuit shown in FIG. 13, a coupling capacitance C is provided between the protection elements 3 and internal circuit 2. Further, one of the electrodes of the capacitor C connected to the input signal line of the internal circuit 2 is pulled up to a positive bias voltage Vbias via a resistor R.

This is an input stage configuration for RF signals. Therefore, the AC potential of the RF signal on the side of the IO terminal 12 is applied in an as-is manner to the two protection elements 3.

It should be noted that the connection of the protection elements 3 is made in the manner as described in the first embodiment (FIG. 1). This connection is preferred because the input signals are high-frequency signals and therefore not affected by the bus resistances. Nevertheless, this does not mean that the connections shown in FIGS. 3 and 4 are excluded from options.

An example of a circuit which should preferably have such a configuration for its input stage is a terrestrial TV tuner receiver circuit.

A terrestrial TV tuner receiver circuit has a high-frequency input signal range from 46 MHz to 880 MHz. Besides, the circuit receives signals whose high-frequency DC level fluctuates. This fluctuation of the DC level occasionally takes place over a wide range from the reference voltage VSS to the source voltage VDD.

Further, as exemplified by a terrestrial TV tuner receiver circuit, today's applications handling large amounts of high-speed data are defined in that high-frequency (RF) signals are used. As a result, the parasitic capacitance of the protection element 3 has to be kept to a minimum to the extent possible.

If the parasitic capacitance allowed in an RF signal line is limited as described above, the above embodiments, and the fourth and fifth embodiments in particular, can provide the protection element 3 meeting the parasitic capacitance limitation.

Further, even if the signal swings above the source voltage VDD (or below the reference voltage VSS) due to the specification of the integrated circuit, the RF signal remains undistorted.

Therefore, the above embodiments, and the fourth and fifth embodiments in particular, provide a bias-free (applicable to bidirectional use) protection element with a low parasitic capacitance for meeting the desired specification at the external connection terminal of the semiconductor integrated circuit having both of the features.

7. Modification Example

In the first to sixth embodiments, and the fourth and fifth embodiments in particular, the N-type well 21 is connected to the reference voltage VSS.

Figure 9B:
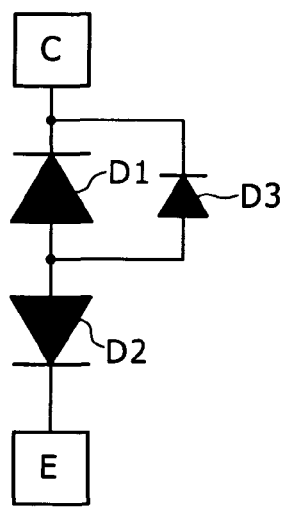

However, the N-type well 21 (refer to FIGS. 5 and 7) may be connected to the IO terminal 12 as illustrated in FIG. 9B. In this case, the diode D3 between the wells is connected in parallel with the diode D1.

Figure 9C:
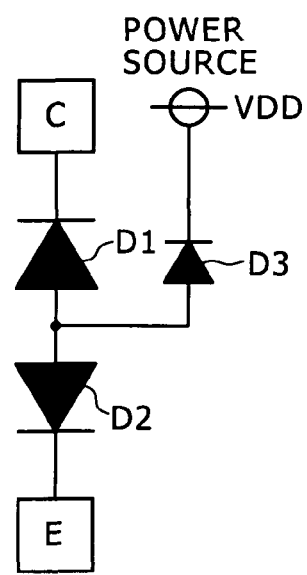

Alternatively, the N-type well 21 may be connected to the source voltage VDD as illustrated in FIG. 9C. In this case, the diode D3 between the wells is connected between the floating node and power source (source voltage VDD).

In either case, the floating condition of the common anode between the diodes D1 and D2 is ensured.

Figure 15A:
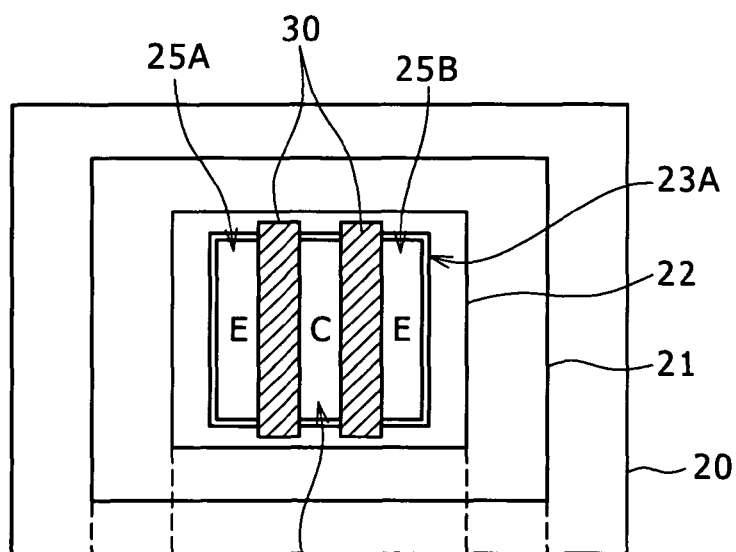
FIGS. 15A and 15B are a plan view and cross-sectional view of a modification example of the protection element shown in FIGS. 5A and 5B (example associated with FIG. 9C)
Figure 15B:
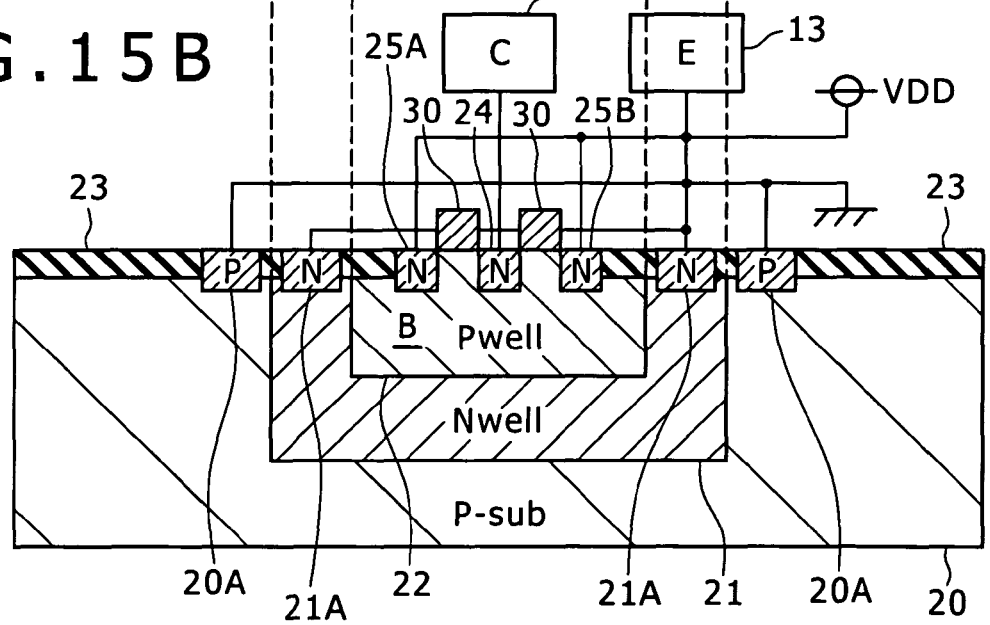

FIGS. 14 and 15 illustrate cross-sectional views of the protection elements when the N-type well 21 is connected as illustrated in FIG. 9C. FIGS. 14A and 14B illustrate a modification example of the protection element shown in FIGS. 7A and 7B. FIGS. 15A and 15B illustrate a modification example of the protection element shown in FIGS. 5A and 5B.

Although similar to the protection elements shown in FIGS. 5 and 7 in that the IO terminal 12 serves as the collector C, the protection elements in the modification examples differ from those shown in FIGS. 5 and 7 in that the source voltage VDD is connected to the emitter E and that the N-type well 21 surrounding the P-type well 22 is connected to the source voltage VDD. The protection elements according to the modification examples operate on the same principle as those shown in FIGS. 5 and 7 in which the N-type well 21 is connected to the reference voltage VSS.

Figure 16A:
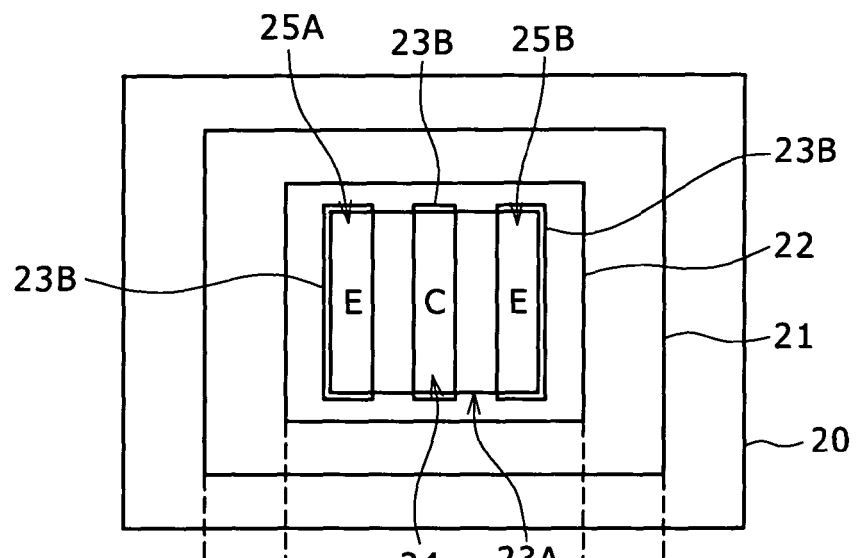
FIGS. 16A and 16B are a plan view and cross-sectional view showing a modification example of the two-dimensional pattern shown in FIGS. 7A and 7B.
Figure 16B:
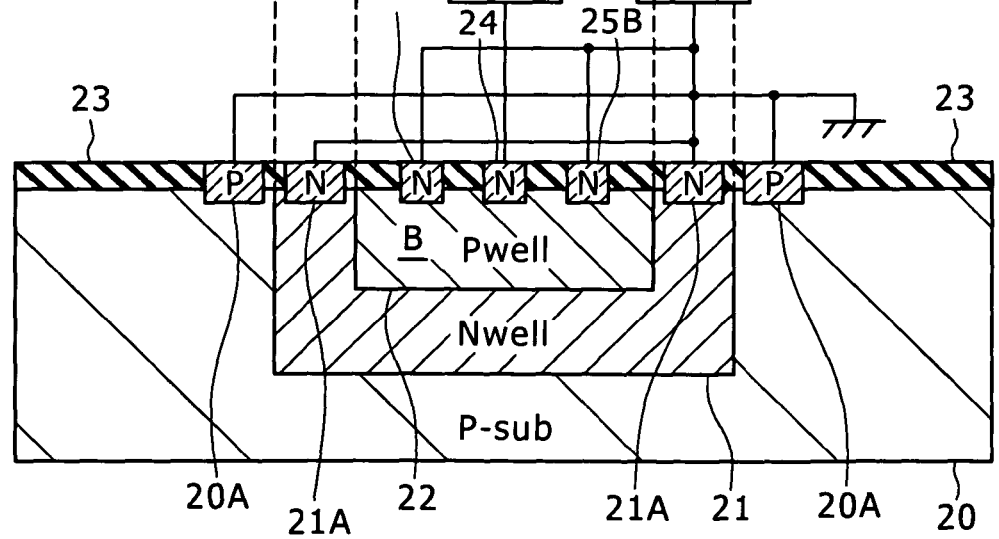
Figure 17A:
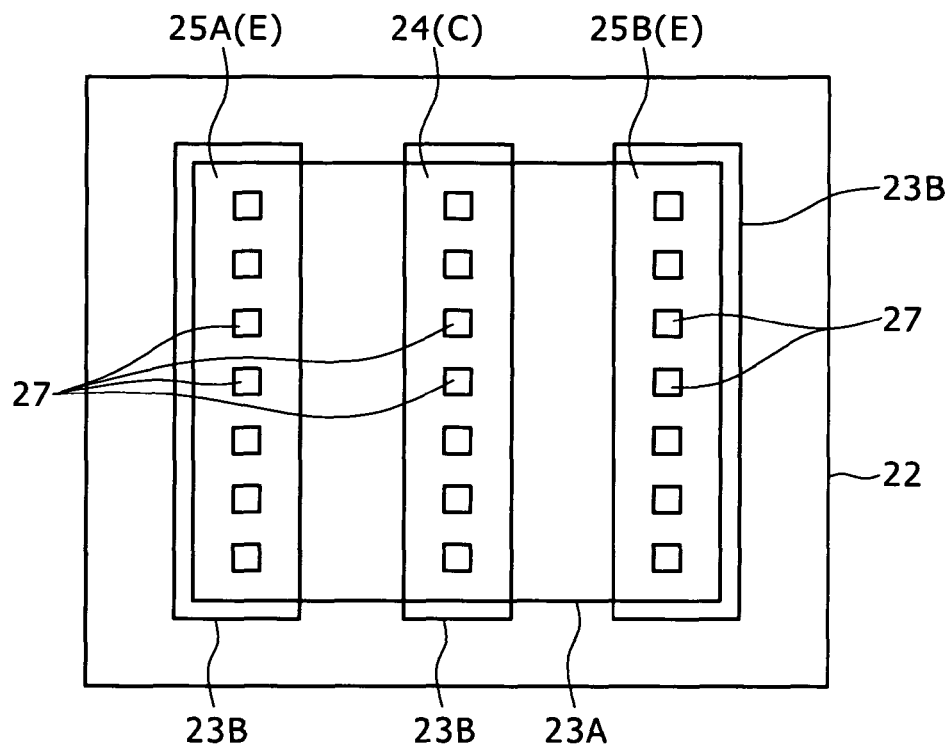
FIGS. 17A and 17B are a plan view and cross-sectional view showing a modification example of the two-dimensional pattern shown in FIGS. 10A and 10B.
Figure 17B:
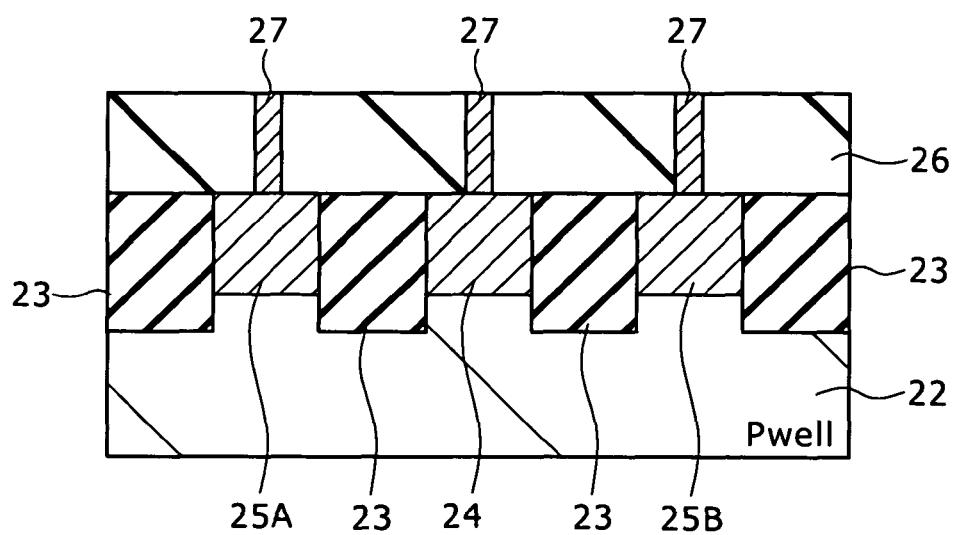
Figure 18A:
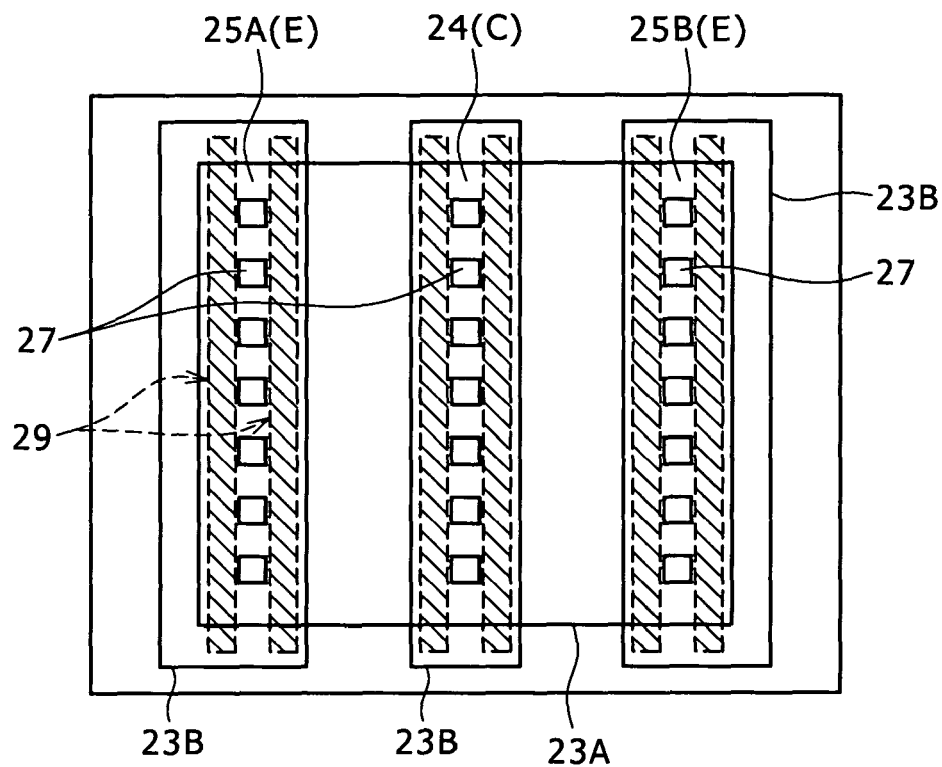
FIGS. 18A and 18B are a plan view and cross-sectional view showing a modification example of the two-dimensional pattern shown in FIGS. 11A and 11B.
Figure 18B:
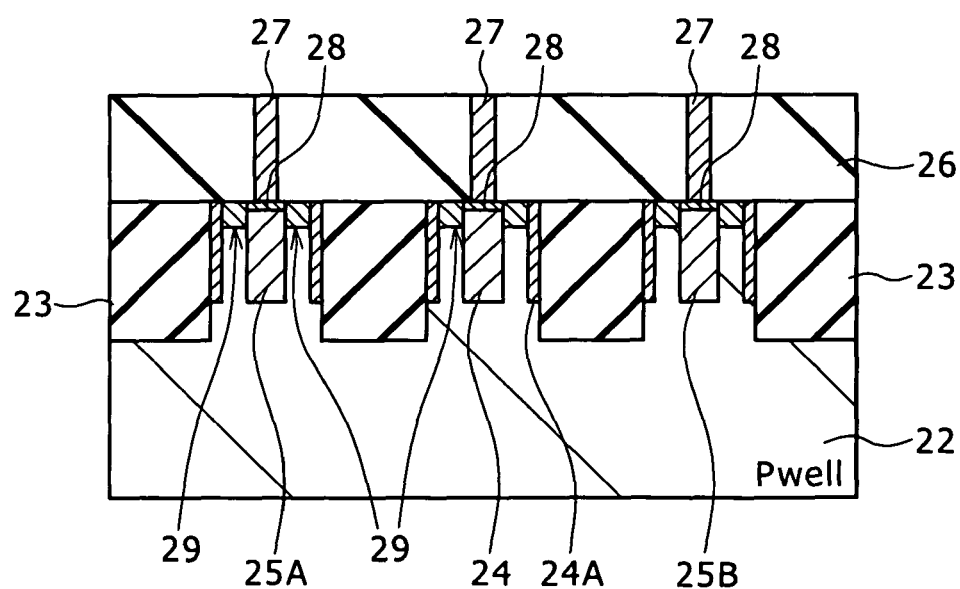

FIGS. 16, 17 and 18 illustrate modification examples (improvement examples) of the protection elements shown in FIGS. 7, 10 and 11.

FIGS. 7, 10 and 11 show two-dimensional patterns improved from those shown in their associated drawings in terms of leak current suppression. It should be noted that leak current may be suppressed properly. Therefore, the description given here does not exclude the fact that the two-dimensional patterns shown in FIGS. 7, 10 and 11 can be implemented.

The improvement of the protection elements shown in FIGS. 16, 17 and 18 is as follows. That is, in FIG. 16, for example, an N-type impurity is injected into the region 23B which is a size larger than the opening portion 23A. Such injection of an N-type impurity into a region a size larger than the opening portion 23A of the element isolation layer 23 is preferred because leak current can be effectively suppressed at the edge portion of the element isolation layer 23. It should be noted that the region 23B can be changed to the size shown in FIG. 16 by changing the resist or other opening pattern a size larger. This eliminates the need to add any pattern or process step. As a result, once a photomask is formed, there are no more cost increasing factors.

The protection elements shown in FIGS. 17 and 18 are basically similar to that in FIG. 16 in pattern shape and purpose. It should be noted that the region 23B is expanded to a size even larger than the silicide block region (shaded areas) including the resistive regions 29 in FIG. 18A.

8. Comparative Examples and Summary of the Effects of the Embodiments

Figure 19:
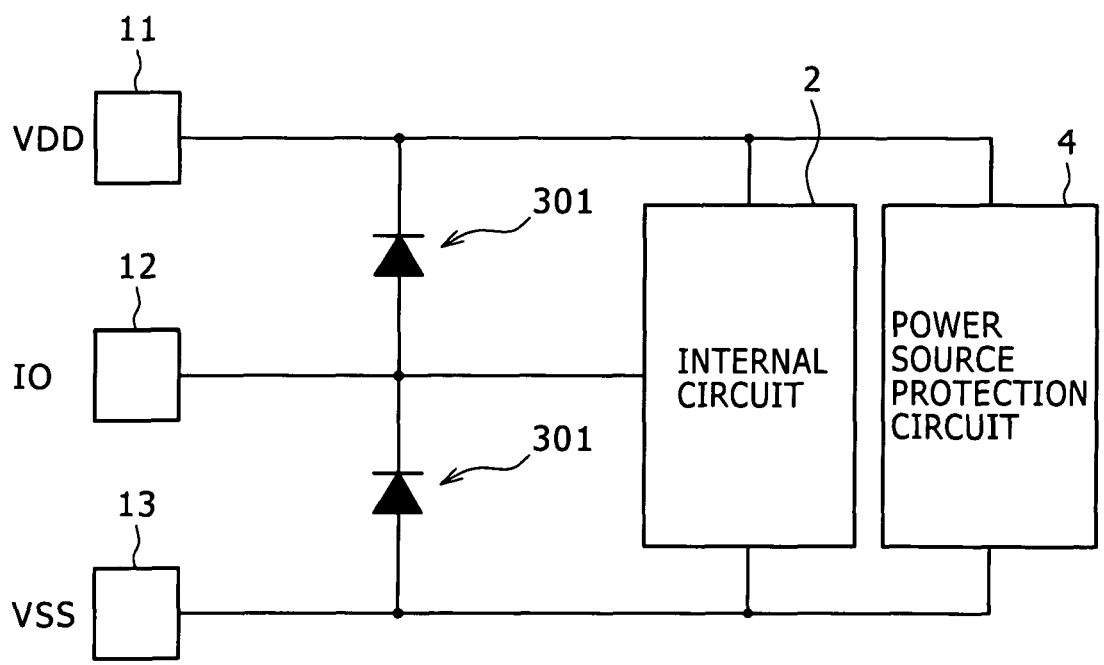
FIG. 19 is a configuration diagram of Comparative Example 1.
Figure 20:
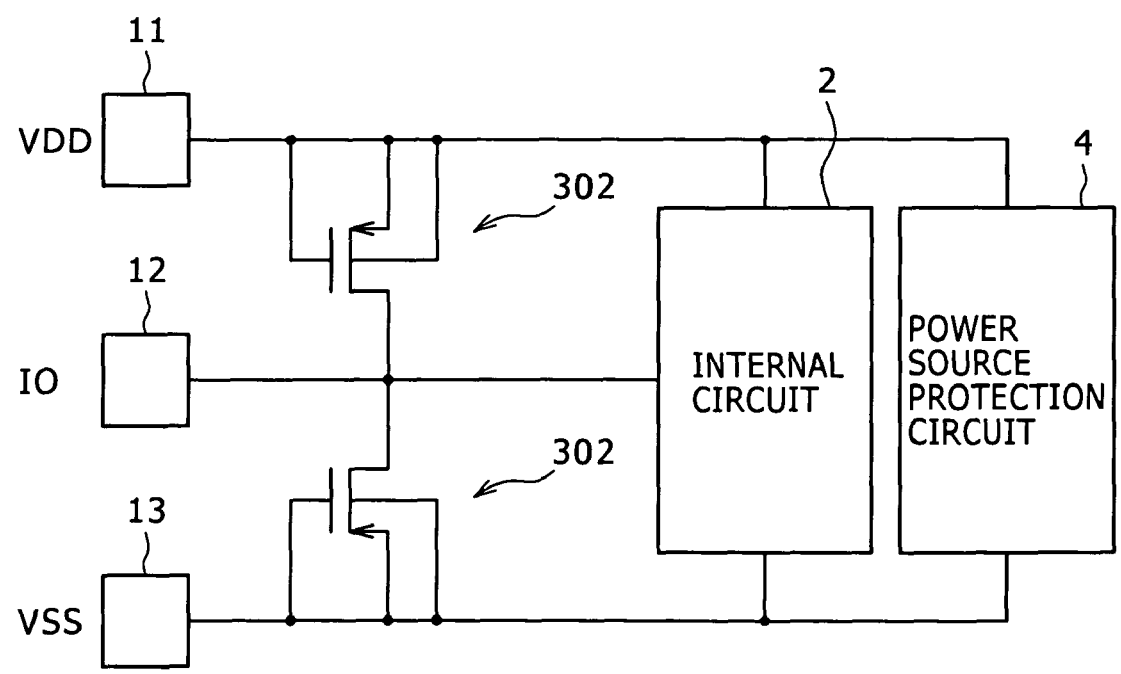
FIG. 20 is a configuration diagram of Comparative Example 2.

FIG. 19 illustrates a protection element 301 according to a first comparative example. FIG. 20 illustrates a protection element 302 according to a second comparative example.

An ESD protection element of a semiconductor integrated circuit commonly includes discrete PN diodes connected together as with the protection element 301 (a plurality of stages of diodes connected to face the same direction) or has a GGMOS configuration as with the protection element 302.

In the case of a high-frequency signal, however, the parasitic capacitance of the MOS transistor-type protection element is often problematic. Further, the signal waveform fluctuates outside the rated voltage range between the power source (source voltage VDD) and GND (reference voltage VSS), containing a voltage below the reference voltage VSS, a level above the source voltage VDD or both of these levels. In this case, the signal is clamped by the diode, making it difficult to use the protection element 301 or 302.

If the protection element 3 according to any one of the first to sixth embodiments and modification examples is used, the internal circuit 2 having stringent capacitance limitations for its high-frequency signal or other terminal in particular can be readily protected in the standard complementary MIS (e.g., CMOS) process steps.

Using the present protection element allows for ready protection of the internal circuit 2 having a terminal whose potential may swing below the reference voltage VSS or above the source voltage VDD in the standard CMOS process steps. It should be noted that the process affinity is extremely high even in the absence of the gate electrode 30 because the protection element 3 can be formed in the standard process for the source or drain region.

If the protection element 3 according to any one of the embodiments of the present invention is used, the internal circuit 2 having stringent capacitance limitations and adapted to receive a signal whose potential fluctuates beyond the amplitude of the power source can be protected at low cost and with ease in the standard CMOS process steps.

The present application contains subject matter related to that disclosed in Japanese Priority Patent Application JP 2008-305039 filed in the Japan Patent Office on Nov. 28, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A semiconductor integrated circuit comprising:
    a protected circuit;
    a protection element formed on the same semiconductor substrate as the protected circuit and adapted to protect the protected circuit, and
    a well-in-well structure formed in the semiconductor substrate for a complementary metal-insulator-smeiconductor transistor circuit,
    wherein:
        the protection element includes two diodes having their anodes connected together to form a floating node and two cathodes connected to the protected circuit,
        the two diodes are formed in a well-in-well structure on the semiconductor substrate, and
        the well-in-well structure with the two diodes formed therein includes:

a P-type well forming a floating gate,
an N-type well which surrounds the surfaces of the P-type well other than that on the front side of the substrate with the deep portion side of the substrate so as to form the cathode of one of the diodes, and
a first N-type region formed in the P-type well so as to form the cathode of the other diode,
wherein the well-in-well structure with the two diodes formed therein has the same structure along the depth of the substrate (depth of the impurity region and concentration profile) as the well-in-well structure for a complementary metal-insulator-semiconductor transistor circuit.

2. The semiconductor integrated circuit of claim 1, wherein
one of the N-type well and the first N-type region is connected to a signal wiring of the protected circuit,
the other of the N-type well and the first N-type region is connected to other wiring connected to the protected circuit, and
the p-type well is not connected to any of a plurality of wirings laminated on the semiconductor substrate via an insulating layer.

3. The semiconductor integrated circuit of claim 1, wherein
a second N-type region is formed at a distance from the first N-type region in the P-type well,
the second N-type region is electrically connected to the N-type well to form an in-substrate structure of a lateral transistor made up of the second N-type region, P-type well and first N-type region.

4. The semiconductor integrated circuit of claim 3, wherein
a gate electrode is formed, via a gate insulating film, to be opposed to the P-type well portion between the first and second N-type regions located at a distance from each other, and
the gate electrode is electrically connected to the N-type well as is the second N-type region.

5. The semiconductor integrated circuit of claim 3, wherein
a complementary metal-insulator-semiconductor transistor circuit is formed in the semiconductor substrate, and
the structure of the first and second N-type regions along the depth of the substrate (depth of the impurity region and concentration profile) is the same as that of the source and drain regions of an N-type metal-insulator-semiconductor transistor contained in the complementary metal-insulator-semiconductor transistor circuit.

6. The semiconductor integrated circuit of claim 3, wherein
the first N-type region having a rectangular two-dimensional pattern and the second N-type region having the same two-dimensional pattern are arranged in the P-type well alternately parallel to each other in a repeated manner along the width of the shorter sides with a given distance therebetween.

\* \* \* \* \*